(12) United States Patent
Lautzenhiser et al.

(10) Patent No.: US 7,936,218 B1
(45) Date of Patent: May 3, 2011

(54) SHARED-CURRENT ELECTRONIC SYSTEM

(75) Inventors: Barry Arthur Lautzenhiser, Carson City, NV (US); Lloyd Lynn Lautzenhiser, Verdi, NV (US)

(73) Assignee: Emhiser Research, Inc., Verdi, NV (US)

( * ) Notice: Subject to any disclaimer, the term of this patent is extended or adjusted under 35 U.S.C. 154(b) by 0 days.

(21) Appl. No.: 12/075,787

(22) Filed: Mar. 13, 2008

Related U.S. Application Data

(63) Continuation-in-part of application No. 11/714,757, filed on Mar. 6, 2007, now abandoned, which is a continuation-in-part of application No. 11/028,107, filed on Jan. 3, 2005, now Pat. No. 7,190,229, which is a continuation-in-part of application No. 10/644,115, filed on Aug. 20, 2003, now Pat. No. 6,900,696.

(51) Int. Cl.
 *H03F 3/68* (2006.01)
(52) U.S. Cl. .................................. 330/295; 330/124 R
(58) Field of Classification Search .................. 330/295, 330/124 R, 84, 126
 See application file for complete search history.

(56) References Cited

U.S. PATENT DOCUMENTS

| | | | | |
|---|---|---|---|---|
| 4,631,493 A * | 12/1986 | Vendelin et al. | ............... | 330/277 |
| 7,123,096 B2 * | 10/2006 | Selin | .............................. | 330/295 |
| 7,425,872 B2 * | 9/2008 | Inamori et al. | ................. | 330/295 |
| 7,598,810 B2 * | 10/2009 | Chao et al. | ..................... | 330/295 |

\* cited by examiner

*Primary Examiner* — Henry K Choe
(74) *Attorney, Agent, or Firm* — Wendell E. Miller Patent Agent

(57) ABSTRACT

Shared-current electronic systems (120, 130, 140, 150, 160, 170, 180, 190, 200, 210, and 220) include two or more electronic devices, such as an electronic device (Q1), a baseband processor (110), and a multiplier/up-converter (112), that are connected in dc series or dc series-parallel, that may be connected in rf series, and that either fixedly or variably share portions of a dc source voltage. Various embodiments produce separate rf outputs, variably shift the phase of a single rf output, variably shift rf power between/among rf outputs, or produce a frequency-compressed modulation. The apparatus includes means (122, 162, 162A, and/or 162B) for precisely proportioning the regulated dc source voltage to one or more of the dc series-connected electronic devices irrespective of production variations in operating parameters of the electronic devices and/or drift of the electronic devices.

27 Claims, 17 Drawing Sheets

SHARED-CURRENT ELECTRONIC SYSTEM

CROSS-REFERENCES TO RELATED APPLICATIONS

This patent application is a Continuation-in-Part of U.S. patent application Ser. No. 11/714,757, filed Mar. 6, 2007, now abandoned which is a Continuation-in-Part of U.S. patent application Ser. No. 11/028,107, filed Jan. 3, 2005, now Issued U.S. Pat. No. 7,190,229, which is a Continuation-in-Part of U.S. patent application Ser. No. 10/644,115, filed Aug. 20, 2003, now Issued U.S. Pat. No. 6,900,696.

STATEMENT RE FEDERALLY SPONSORED RESEARCH OR DEVELOPMENT (Not Applicable)

REFERENCE TO SEQUENCE LISTING (Not Applicable)

BACKGROUND OF THE INVENTION

1. Field of the Invention

The present invention relates generally to connecting electronic devices in dc series, and in either rf series or parallel. More particularly, the present invention pertains to connecting electronic devices in dc series, and precisely proportioning a dc source voltage to at least one of the electronic devices irrespective to production variations in component operating parameters or drift in component parameters.

2. Description of the Related Art

Frequently, maximum operating voltages of solid-state electronic devices are too low for the dc source voltage that is available. By connecting the solid-state electronic devices in dc series, the dc source voltage may be divided between, or among, a plurality of solid-state electronic devices, either equally or proportionally, as desired, thereby providing dc voltages that are usable for any desired type of solid-state electronic device, and thereby also sharing the same dc current flow.

Since the solid-state electronic devices are stacked in series between a dc source voltage and an electrical ground, this type of electronic system has been called a "totem-pole" electronic circuit. However, since all of the solid-state electronic devices share the dc current, herein this type of electronic system is called a "shared-current electronic system."

The dc source voltage may be divided either proportionally or variably, and other types of electronic devices, such as bandwidth processors, may be connected in dc series with an other solid-state electronic device. The inputs and outputs of the electronic devices, whether rf or lower frequencies, may be connected in either series or parallel.

As an example of equal or proportional division of the dc source voltage, gallium arsenide field-effect transistors (GaAsFETs) are the primary solid-state devices used for amplification of high frequency signals in the range of 3.0 GHz and higher. GaAsFETs have the advantages of being readily available and relatively inexpensive. However, a major disadvantage of GaAsFETs is that the maximum operating voltage is commonly +10.0 volts dc.

For many transmitter/amplifier applications, particularly airborne applications, the dc source voltage is 28.0 volts dc, plus or minus 4.0 volts dc. Since gallium arsenide FETs have an operative voltage of +10.0 volts dc, the use of gallium arsenide FETs has presented a problem.

Traditionally, there have been two solutions to this problem: linear voltage regulators and switching voltage regulators. Linear voltage regulators have the disadvantages of excessive heat generation and low power efficiency. And, switching voltage regulators have the disadvantages of increased cost, space inefficiency, and the creation of a spurious signal on the rf carrier (EMI problems) due to the switching action of the regulator.

A third approach to solving the problem of disparity between the operating voltage of solid-state devices and a dc source voltage has been to connect the solid-state electronic devices in dc series, thereby dividingly sharing the dc source voltage and utilizing the same current flow. This shared-current approach was presented in *IEEE Transactions on Microwave Theory and Techniques*, Volume 46, Number 12, of December 1998, in an article entitled "*A 44-GHz High IP3 InP-HBT Amplifier with Practical Current Reuse Biasing.*"

Shared-current electronic systems solve the problem of the disparity between the operating voltage of solid-state devices and a higher source voltage. Two or more solid-state electronic devices are connected in series for dc operation.

That is, current that flows in series through the solid-state devices is used two, or more, times in the production of the rf output. The dc current is used once in each of two, or more, series-connected solid-state electronic devices, thereby increasing the rf output for a given current flow, as compared to rf amplifiers connected in the conventional fashion.

However, shared-current electronic systems have been used only at low rf powers, as in the above-referenced article wherein the power was in the order of 100.0 milliwatts. At higher rf powers, problems associated with inadequate rf decoupling have included low power efficiency, oscillation, a decrease in reliability of the circuits, and destruction of the solid-state devices.

Power limitations with regard to aforesaid problems were solved by Lautzenhiser et al., as taught in U.S. Pat. No. 6,683,499 that issued on Jan. 27, 2004, and which is incorporated herein by reference thereto.

Although there was nothing in the literature that hinted of rf power limitations for shared-current systems, factors that might cause component failure at higher rf powers, or solutions to any such problems, Lautzenhiser et al. solved this rf power limitation of shared-current electronic systems by providing improved rf decoupling.

More particularly, Lautzenhiser et al. teach providing rf decoupling with an effective series resistance that is less than that of the best capacitors, namely porcelain capacitors. Providing rf decoupling with an effective series resistance that is lower than that of the best capacitors is achieved by paralleling porcelain capacitors. Capacitors are parallel to provide these reduced effective series resistances at single frequencies or over a band of frequencies by paralleling a plurality of capacitors that resonate at the same or spaced-apart frequencies.

While one reason for connecting solid-state devices includes the low operating voltages of GaAsFETs with respect to the dc source voltage, an other reason for connecting solid-state devices in series is to variably proportion the dc source voltage between, or among, two or more solid-state electronic devices.

The dc source voltage may be variably proportioned between, or among, two or more solid-state electronic devices for the purpose of phase shifting an rf output as taught by Lautzenhiser et al. in U.S. Pat. No. 6,690,238 which issued on Feb. 10, 2004, and which is incorporated herein by reference thereto.

The dc source voltage may also be variably proportioned for the purpose of variably shifting or proportioning, or even rapidly switching, rf power from one antenna to an other, as taught by Lautzenhiser et al. in U.S. Pat. No. 6,747,517 which issued on Jun. 8, 2004, and which is incorporated herein by reference thereto.

Further, as taught by Lautzenhiser et al., in U.S. patent application Ser. No. 10/644,115, filed Aug. 20, 2003, which issued as U.S. Pat. No. 6,900,696 on May 31, 2005, and which is incorporated herein by reference thereto, a solid-state electronic device, such as a FET, may be connected in dc series with a processing electronic device, such as an oscillator or a baseband processor, that may include hundreds of discrete components. By dc series-connecting the solid-state electronic device and the processing electronic device in dc series, and proportionally dividing the dc source voltage between the devices, a dc voltage suitable for each device is provided, the dc current is shared, the use of a voltage regulator is obviated, and power efficiency is increased greatly.

An important use of shared-current electronic systems is in spectrally-efficient digital modulation systems such as SOQPSK (Tier I) or multi-h CPM (Tier II) in which the quantity of data in a given bandwidth is doubled or tripled respectively as compared to the PCM/FM (Tier 0) waveform. Importantly, the shared-current principle also increases the power efficiency of electronic systems that use Tier 0, Tier I, and Tier II waveforms, since all three waveforms (Tier 0, Tier I, and Tier II) may be produced by the same hardware by making a change in the software.

Unless rf decoupling is provided as taught by Lautzenhiser et al. in U.S. Pat. No. 6,683,499, reduced efficiency will certainly occur, and both instability and destruction of the solid-state electronic devices may occur. More particularly, if one of the solid-state electronic devices goes into unstable self-oscillation, it will consume more dc bias and most likely become over biased resulting in destruction of the solid-state device.

In a shared-current configuration that uses FETs, all FETs may be destroyed if one FET fails, depending on how the first FET fails. For example, if the upper FET oscillates and consumes the dc bias, it will be over-biased and will be destroyed. If, in the destruction, the drain and source short circuit, which is a common type of failure, the lower FET will be over-biased, too, so that the lower FET will also fail.

Inadequate rf decoupling, at the very least results in poor efficiency. At the worst, and with higher likelihood at higher rf outputs, it results in destruction of the FETs and/or damage or destruction of circuits connected to the FET inputs and outputs.

However, even though adequate rf decoupling, as taught by Lautzenhiser et al., allows higher, and seemingly almost unlimited rf outputs, production variations of component operating parameters and drift of component operating parameters caused by aging and temperature variations combine to provide an other limitation to rf power outputs.

More particularly, when solid-state electronic components are connected in dc series between a dc source voltage and an electrical ground, an increase, or a decrease, in the percentage of the dc source voltage that is used by one of the solid-state electronic components inversely affects the percentage of the dc source voltage that is applied to the other solid-state component(s). This problem is compounded if more than two solid-state electronic components are connected in dc series.

Therefore, production variations in component parameters, with or without drift of component parameters, can cause failure of one solid-state electronic component, and failure of one electronic component can cascade into failure of other solid-state electronic components, and also cause failure of input and output devices, in like manner as described above for failures caused by inadequate rf decoupling.

Finally, Lautzenhiser et al, in U.S. patent application Ser. No. 11/028,107, filed Jan. 3, 2005, which issued as U.S. Pat. No. 7,190,229 on Mar. 13, 2007, and which is incorporated herein by reference thereto, overcomes this additional rf output limitation by precisely proportioning percentages of the dc source voltage that are utilized by individual ones of the several dc series-connected solid-state electronic devices irrespective of production variation of component operating parameters and drift of component operating parameters. More particularly, an electronic device that is called a "precise proportioner" is connected to lower-voltage and input terminals of all of the dc series-connected solid-state electronic devices except for the one nearest the electrical ground.

BRIEF SUMMARY OF THE INVENTION

In the present invention, two or more solid-state electronic devices, or at least one solid-state electronic device and at least one other electronic device, are connected in series between positive and negative terminals of a dc source voltage, thereby proportioning the dc source voltage between or among the electronic devices. The solid-state electronic devices may be gallium arsenide field-effect transistors (GaAsFETs) or any other type of solid-state electronic device. All of the dc series-connected electronic devices may use the same current flow, or some current may be bypassed around an electronic device that uses less current than an other current-sharing device.

Alternately, two solid-state electronic devices that use less current are connected in dc parallel in a stack with two or more solid-state electronic devices to best utilize, not only the dc source voltage, but also the current required by the power-amplifying FETs.

If the solid-state electronic devices are field-effect transistors (FETs), the FETs are stacked like a totem pole with the drain of a top, or upper, FET being operatively connected to a relatively high positive potential, a source terminal of the top FET being connected to a drain terminal of a lower FET, and a source terminal of the lower FET being connected to a lower voltage.

In some embodiments, an rf power splitter is used to split the rf input two or more ways for the gates of the FETs. In various ones of the embodiments, an rf power combiner is connected to the drain terminals of the FETs to combine the rf outputs.

A negative gate-to-source bias for the lower FET controls current flow through all FETs, which in turn controls power amplification. Various embodiments of the present invention control the gate-to-source bias of the higher FET(s) in unique and useful ways, thereby providing unique and useful ways of controlling both current flow through the FETs and amplification of the rf power amplifier.

In addition to proportioning a dc source voltage between, or among, a plurality of solid-state amplifying devices in fixed proportions for the purpose of providing dc voltages that are usable by various types of solid-state amplifying devices, the dc source voltage may be variably proportioned between, or among, a plurality of solid-state amplifying devices.

The dc source voltage may be variably proportioned for the purpose of variably shifting a phase angle of an rf output, or the dc source voltage may be variably proportioned for the purpose of selectively proportioning, or switching, rf power from one rf output and an antenna to an other rf output and its antenna.

While in some embodiments of the present invention a power combiner is used to combine the rf signals after being power amplified by the FETs, in other embodiments, the rf signals are used separately.

In still other embodiments, separate rf inputs, which may be at different frequencies, different levels, and different modulation types, are separately amplified, and then combined to produce both rf signals in a single rf output.

Finally, a solid-state electronic device may be connected in dc series with a processing electronic device that may include hundreds of discrete solid-state components. For instance, Shaped-Offset QPSK modulation (SOQPSK) is power inefficient because of the current flow that is required for modulated signal generation. However, by using the same current, both for modulated signal generation and rf power amplification, as taught herein, overall power efficiency is improved greatly.

Conventionally, rf power amplifying J-FETs are biased with a negative dc voltage applied to the gate terminal, a positive power supply dc voltage applied to the drain terminal, and the source terminal attached to a circuit ground. Preferably, however, as shown and taught herein, the source terminal of the lower FET is connected to an electrical ground through a resistor, thereby causing the FET to self-bias, eliminating the need for a negative voltage for the gate terminal.

The design and selection of the dc bias, rf chokes, and rf decoupling capacitors are critical to the operation and performance of current-sharing rf amplifier circuits, particularly in high-power rf applications, as taught by Lautzenhiser et al. in U.S. Pat. No. 6,683,499. Improperly designed dc bias circuits can result in a reduction of power efficiency, destruction of one or more amplifying FETs, or a decrease of the reliability in the solid-state devices, especially at all but the lowest rf powers.

However, even when current-sharing electronic systems are provided with proper rf decoupling, as taught herein, the maximum rf output is limited, and or reliability is sacrificed because of production variations in the operating parameters of the solid-state electronic components and drift of component operating parameters. The present invention overcomes this final limitation to the practicality of shared-current electronic systems by precisely proportioning the dc source voltage used by at least one of the solid-state electronic components irrespective of production variations in component operating parameters and/or drift in operating parameters of the electronic components.

This precise proportioning is accomplished by clamping the dc voltage used by one of the solid-state electronic components. That is, if two solid-state electronic components are used, the one nearest the source voltage is clamped. If three, or more, solid-state electronic components are used, the dc voltages of all of the solid-state components are clamped, except for the solid-state electronic component that is nearest the electrical ground.

However, for use in phase-shifting and power-shifting circuits, where dc voltages are variably proportioned to the solid-state electronic devices, the percentages of the dc source voltage used by at least one of the solid-state devices is clamped to precisely follow varying proportioning voltages that is generated by a proportioning control, thereby more precisely phase or power shifting an rf output irrespective of component operating parameters.

Therefore, whether the solid-state devices are FETs, bipolar transistors, processing electronic devices, and/or bandwidth processors, the dc source voltage is precisely proportioned to at least one of the solid-state devices.

In a first aspect of the present invention, a method comprises: variably amplifying a first rf signal in a first electronic device into a variable rf output; simultaneously amplifying a second rf signal in a second electronic device into a second rf output; the amplifying steps comprise inversely changing portions of a dc source used by each electronic device; and preventing operating parameters in one or both of the electronic devices or drift of the operating parameters in one or both of the electronic devices from affecting more than one of the portions.

In a second aspect of the present invention, a method comprises: amplifying a first rf signal in a first electronic device into a first rf output; simultaneously amplifying a second rf signal in a second electronic device into a second rf output; the amplifying steps comprise each of the electronic devices using separate portions of a single dc source; and preventing operating parameters in one or both of the electronic devices or drift of the operating parameters in one or both of the electronic devices from affecting more than one of the portions.

In a third aspect of the present invention, a method comprises: variably amplifying a plurality of rf signals in a plurality of electronic devices into a plurality of variable rf outputs; the amplifying steps comprise each of the amplifying steps using separate portions of a dc source; and preventing operating parameters in any or all of the electronic devices or drift of the operating parameters in any or all of the electronic devices from affecting more than one of the portions.

In a fourth aspect of the present invention, apparatus comprises: a dc source; means, comprising a plurality of electronic devices that each use separate portions of the dc source, for variably amplifying a plurality of rf signals into a plurality of variable rf outputs; and means for preventing operating parameters in any or all of the electronic devices or drift of the operating parameters in any or all of the electronic devices from affecting more than one of the portions.

In a fifth aspect of the present invention, a method comprises: connecting a plurality of rf electronic devices into dc series with a dc source; and causing at least two of said electronic devices to take a precise portion of said dc source irrespective of initial operating parameters in any or all of said electronic devices or drift of said operating parameters in any or all of said electronic devices.

DETAILED DESCRIPTION OF THE INVENTION

Figure 1:
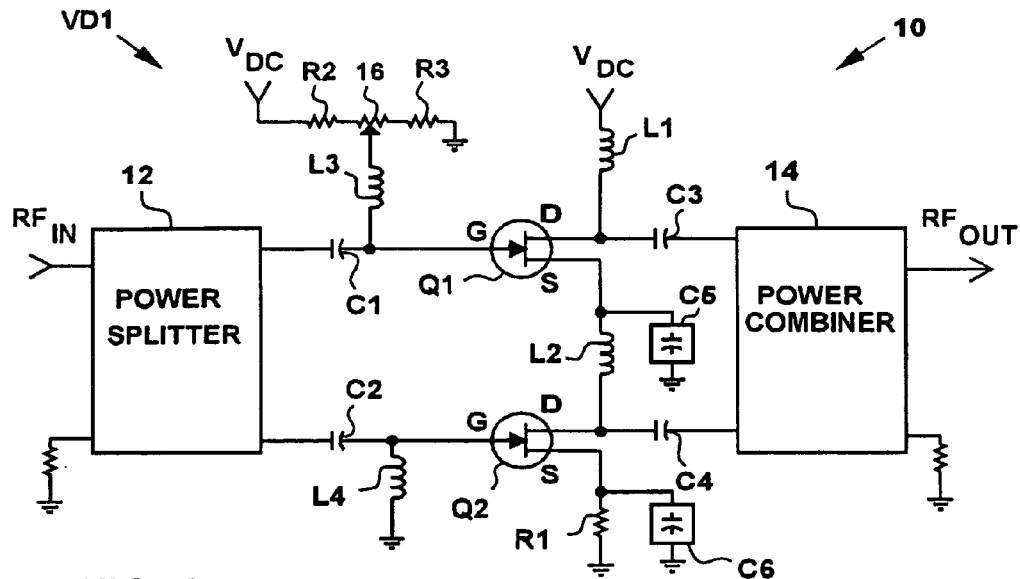
FIG. 1 is a variable phase-shifting rf amplifier, an rf power amplifier, or a shared-current electronic system, in which two n-channel, gallium arsenide field-effect transistors (GaAsFETs) are connected in dc series to proportionately share, or dividingly share, the dc source voltage, and rf decoupling is included as taught in conjunction with FIG. 4.

Referring now to FIG. 1, an rf power amplifier, shared-current electronic system, or electronic apparatus, 10 includes solid-state amplifying devices, solid-state electronic devices, n-channel gallium arsenide field-effect transistors, GaAsFETs, or FETs, Q1 and Q2 that are connected in dc series between a positive dc source voltage, $V_{DC}$ and an electrical ground.

A first rf choke L1 connects the dc source voltage $V_{DC}$ to a drain terminal of the FET Q1, a second rf choke L2 connects a source terminal of the FET Q1 to a drain terminal of the FET Q2, and a resistor R1 connects a source terminal of the FET Q2 to the electrical ground.

The rf power amplifier 10 also includes an rf power splitter 12 and an rf power combiner 14. The rf power splitter 12 is connected to gate terminals of the FETs Q1 and Q2, respectively, by coupling capacitors C1 and C2. The rf power combiner 14 is connected to drain terminals of the FETs Q1 and Q2, respectively, by coupling capacitors C3 and C4. And source terminals of the FETs Q1 and Q2 are connected to the electrical ground by decoupling capacitors C5 and C6, which are represented schematically by boxes that are labeled C5 and C6.

A variable voltage divider VD1, that includes a potentiometer 16 and resistors R2 and R3, is connected to the dc source voltage $V_{DC}$ and supplies a bias voltage to the gate terminal of the FET Q1 through a third rf choke L3. The resistor R1 supplies a negative gate-to-source bias for the gate terminal of the FET Q2 through a fourth rf choke L4.

The resistor R1, in setting the gate-to-source bias for the FET Q2, controls current flow through both FETs, Q1 and Q2. It is important to remember this fact, since other embodiments of the present invention use various means for controlling the gate-to-source bias for the FET Q2, thereby providing means for controlling power amplification of the rf power amplifier 10.

Continuing to refer to FIG. 1, if the dc source voltage is 22.0 volts dc, and if the resistor R1 provides a 2.0 voltage drop between the source terminal of the FET Q2 and the ground, assuming equal current through the FETs, Q1 and Q2, the remaining 20.0 volts will be equally divided, thereby providing 10.0 volts for each FET, Q1 and Q2, with the FET Q1 having 22.0 volts applied to the drain terminal and 12.0 volts applied to the source terminal.

If the potentiometer 16 of the variable voltage divider VD1 is proportioned to provide 10.0 volts to the gate terminal of the FET Q1, a negative gate-to-source bias of 2.0 volts will be provided for the FET Q1. In like manner, with 12.0 volts being applied to the drain terminal of the FET Q2 and 2.0 volts being applied to the source terminal, the electrical ground will be 2.0 volts below the voltage that is applied to the source terminal, thereby providing a negative gate-to-source bias of 2.0 volts for the FET Q2, since the gate terminal of the FET Q2 is connected to the electrical ground through the rf choke L4.

In operation, an input signal at an rf input $RF_{IN}$ is split in the rf power splitter 12, amplified in the FETs Q1 and Q2, and combined in the rf power combiner 14 to provide a power amplified rf output at an rf output $RF_{OUT}$.

The amplification function of the FETs Q1 and Q2 is maintained by using rf chokes, L1, L2, L3, and L4, to keep the rf signal from coupling onto the dc bias lines and to prevent rf interference between the FETs Q1 and Q2. Decoupling capacitors C5 and C6 are used to keep the source terminals of both FETs, Q1 and Q2, at an rf ground.

Figure 2:
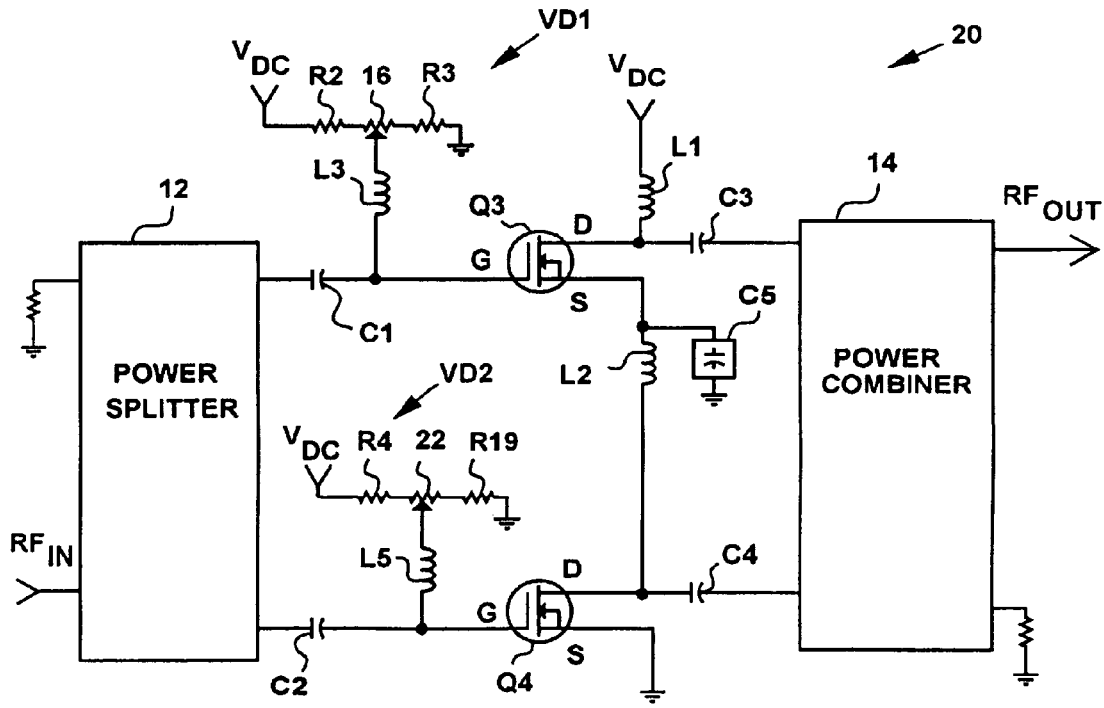
FIG. 2 is a variable phase-shifting rf amplifier, an rf power amplifier, or a shared-current electronic system, that is similar to FIG. 1, except that the GaAsFETs of FIG. 1 have been replaced by n-channel MOSFETs.

Referring now to FIG. 2, an rf power amplifier, shared-current electronic system, or electronic apparatus, 20 includes like-numbered and like-named parts, as shown and described in conjunction with FIG. 1, except that the rf power amplifier 20 of FIG. 2 replaces the GaAsFETs Q1 and Q2 of FIG. 1 with n-channel MOSFETs, FETs, solid-state amplifying devices, or solid-state electronic devices, Q3 and Q4 that are connected in series between a positive dc source voltage $V_{DC}$ and an electrical ground.

The MOSFET Q4 operates with a positive bias, so the resistor R1, the decoupling capacitor C6, and the rf choke L4, all of FIG. 1, have been omitted. Instead, a variable voltage divider VD2, that includes a potentiometer 22 and resistors R4 and R19, has been added to provide a bias voltage for the MOSFET Q4. The variable voltage divider VD2 is connected to a gate of the MOSFET Q4 by an rf choke L5.

The rf power amplifier 20 takes advantage of the fact that MOSFETs, such as the MOSFETs Q3 and Q4, will operate at higher voltages than GaAsFETs, such as the GaAsFETs Q1 and Q2 of FIG. 1. For instance, the rf power amplifier 20 may use a 56.0 volt dc source, and the dc source voltage may be equally divided between the MOSFETs Q3 and Q4 which are rated for 28.0 volts dc.

If a 56.0 volt dc source voltage is equally divided, the gate voltage for the MOSFET Q3 is adjusted to 32.0 volts by the variable voltage divider VD1, so that the gate of the MOSFET Q3 is 4.0 volts above its source voltage, such as to set the quiescent operating point of the MOSFET Q3. In like manner, the variable voltage divider VD2 is adjusted to 4.0 volts, so that the gate of the MOSFET Q4 is 4.0 volts above its electrically-grounded source terminal.

Figure 3:
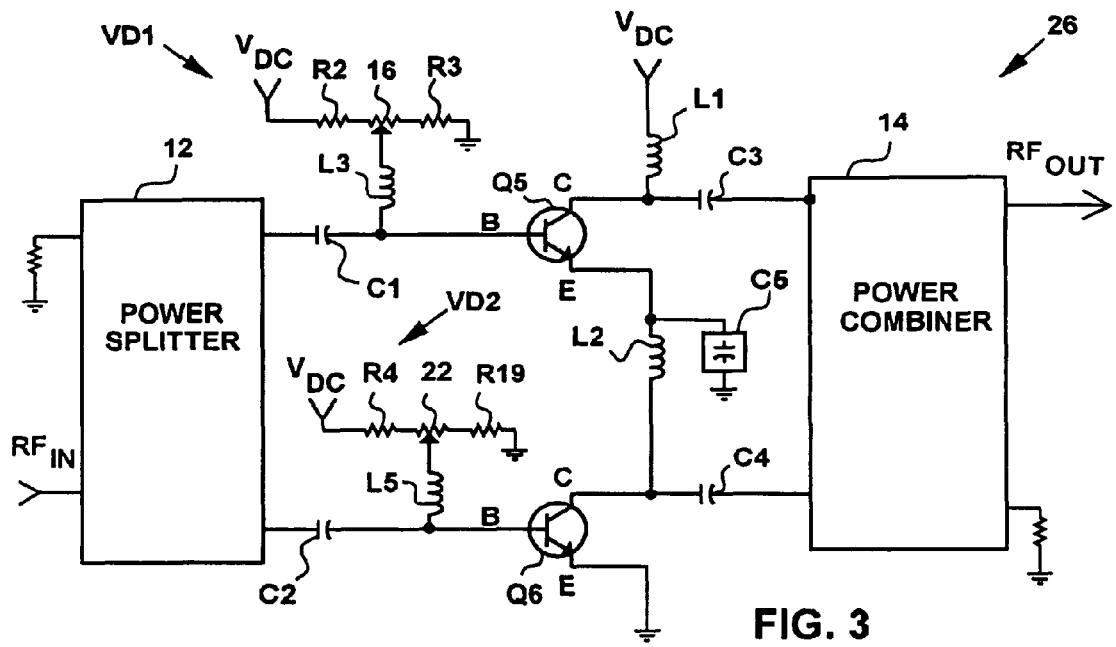
FIG. 3 is a variable phase-shifting rf amplifier, an rf power amplifier, or a shared-current electronic system, that is similar to FIG. 1, except that the GaAsFETs of FIG. 1 have been replaced by npn bipolar-junction transistors (BJTs)

Referring now to FIG. 3, an rf power amplifier, shared-current electronic system, or electronic apparatus, 26 includes like-numbered and like-named parts, as shown and described in conjunction with FIG. 1, except that the rf power amplifier 26 of FIG. 3 replaces the GaAsFETs Q1 and Q2 of FIG. 1 with npn bipolar-junction transistors (BJTs), solid-state amplifying devices, or solid-state electronic devices, Q5 and Q6 that are connected in series between a positive dc source voltage $V_{DC}$ and a ground.

Since the BJT Q6 operates with a positive bias, the resistor R1, the decoupling capacitor C6, and the rf choke L4, all of FIG. 1, have been omitted, the variable voltage divider VD2, that includes the potentiometer 22 and the resistors R4 and R19, has been added. The variable voltage divider VD2 is connected to a base of the BJT Q6 by the rf choke L5.

The rf power amplifier 26 takes advantage of the fact that bipolar-junction transistors (BJTs), such as the BJTs Q5 and Q6, will operate at higher voltages than GaAsFETs, such as the GaAsFETs Q1 and Q2 of FIG. 1. For instance, the rf power amplifier 26 may use a 56.0 volt dc source, and the dc source voltage may be equally divided between the BJTs Q5 and Q6.

If a 56.0 volt dc source voltage is equally divided, the base voltage for the BJT Q5 is adjusted to 28.7 volts by the variable voltage divider VD1, so that the base of the BJT Q5 is 0.7 volts above its emitter voltage. In like manner, the variable voltage divider VD2 is adjusted to 0.7 volts, so that the base of the BJT Q6 is 0.7 volts above its grounded emitter.

Operation of the rf power amplifiers, or shared-current electronic systems, 20 and 26, of FIGS. 2 and 3 respectively, can be understood by referring to the detailed description of FIG. 1.

The performance of the rf power amplifiers 10 of FIG. 1, 20 of FIG. 2, 26 of FIG. 3, and all of the current-sharing electronic systems taught herein, rests heavily on correct design and application of the rf chokes, L1, L2, L3, and L4, and especially on the decoupling capacitors, C5 and C6. More particularly, successful rf decoupling depends upon providing an effective series resistance of the decoupling capacitors C5 and C6 that is lower than any porcelain capacitor that resonates at the operating frequency.

Figure 4:
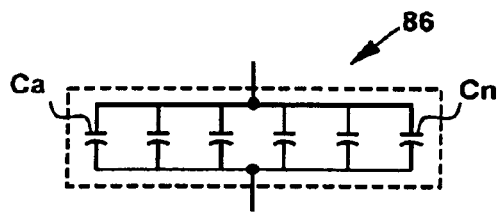
FIG. 4 is a low ESR capacitor assembly in which the effective series resistance (ESR) of rf decoupling capacitances are reduced below the ESR of any porcelain capacitor, that resonates at a given operating frequency, by paralleling a plurality of capacitors, which is used in all of the shared-current electronic systems taught herein.

Referring now to FIGS. 1-4, and more particularly to FIG. 4, this reduction in the effective series resistance of the decoupling capacitors is achieved by paralleling capacitors as shown in FIG. 4. Any number of capacitors Ca-Cn can be paralleled, and the capacitors can be selected to resonate at the same frequency or at different frequencies.

For operation at a single, fixed frequency, capacitors that resonate at the same frequencies may be selected. However, if a standard capacitor does not resonate at the operating frequency, capacitors that resonate both above and below the operating frequency can be paralleled. In like manner, for operation over a spread of frequencies, a plurality of capacitors, that resonate at various frequencies are paralleled.

Referring again to FIG. 1, the decoupling capacitors C5 and C6 are shown enclosed in a rectangular box indicating that the rf decoupling capacitors are paralleled as shown in FIG. 4. However, all of the decoupling capacitors, in all of the embodiments, should be paralleled as taught by Lautzenhiser et al. in U.S. Pat. No. 6,683,499, whether or not the rf decoupling capacitors are shown enclosed in a box.

Figure 5:
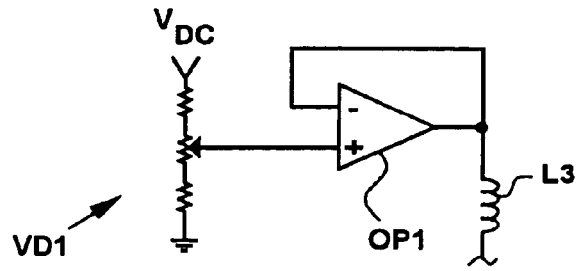
FIG. 5 illustrates an operational amplifier being used as a buffer to prevent current-caused changes in a bias voltage for the shared-current electronic systems such as those of FIGS. 1-3.

Referring now to FIG. 5, an operational amplifier OP1, that is configured as a buffer, has been inserted between the variable voltage divider VD1 and the rf choke L3 of FIG. 1. If the gate current of the FET Q1 changes when the amplifier is tuned across a frequency band or operated over varying environmental conditions, the operational amplifier OP1 prevents varying gate current from affecting the variable voltage divider VD1 and, therefore, the bias of both FETs, Q1 and Q2.

Figure 6:
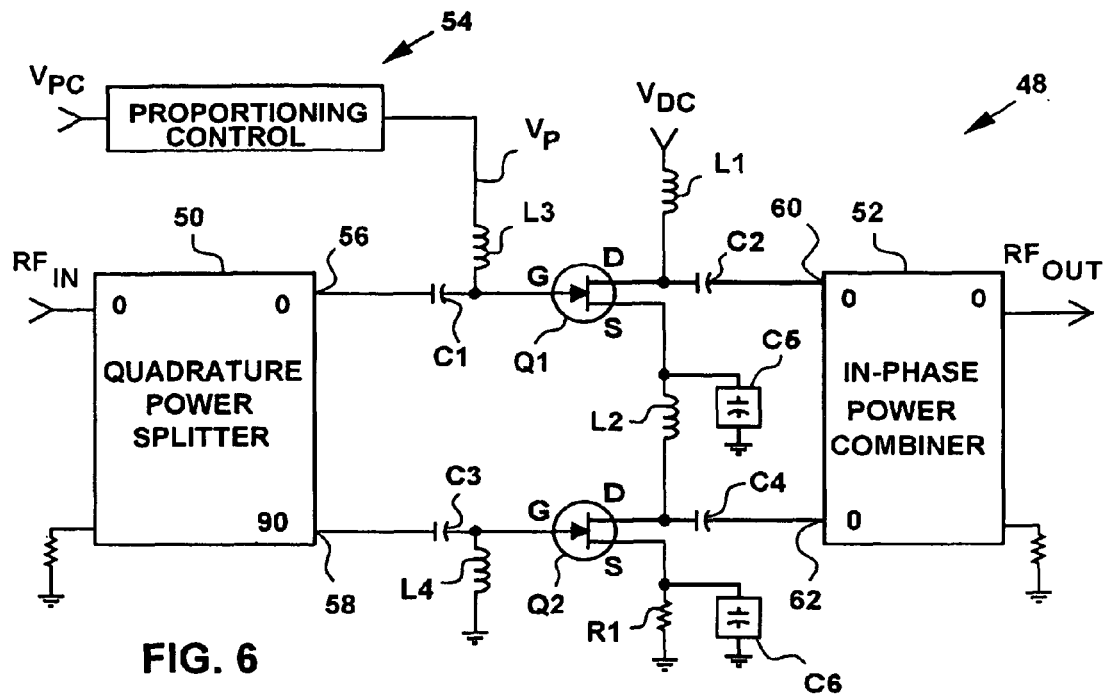
FIG. 6 is a variable phase-shifting rf power amplifier, or a shared-current electronic system in which two, n-channel GaAsFETs are stacked to selectively utilize a source voltage, and in which an rf output can be shifted up to 90 degrees proportional to, and substantially linearly with, a proportioning voltage.

Referring now to FIG. 6, a variable phase-shifting rf power amplifier, shared-current electronic system, or electronic apparatus, 48 includes solid-state amplifying devices, solid-state electronic devices, field-effect transistors, or FETs, Q1 and Q2, that are connected in series between a higher voltage, or positive dc source voltage $V_{DC}$, and a lower voltage, or an electrical ground. That is, the rf choke L1 connects the dc source voltage $V_{DC}$ to the drain terminal of the FET Q1, the rf choke L2 connects the source terminal of the FET Q1 to the drain terminal of the FET Q2, and the resistor R1 connects the source terminal of the FET Q2 to the electrical ground, as described in conjunction with FIG. 1.

The variable phase-shifting rf power amplifier 48 also includes an rf quadrature power splitter 50 and an rf in-phase power combiner 52. The quadrature power splitter 50 is connected to gate terminals of the FETs Q1 and Q2, by the coupling capacitors C1 and C3, respectively. The rf power combiner 52 is connected to the drain terminals of the FETs Q1 and Q2, respectively, by the coupling capacitors C2 and C4. And source terminals of the FETs Q1 and Q2 are connected to an electrical ground by decoupling capacitors C5 and C6, respectively.

A proportioning control 54 provides a variable proportioning voltage $V_P$, in response to a proportioning control voltage $V_{PC}$, and supplies the proportioning voltage $V_p$ to the gate terminal of the FET Q1 through the rf choke L3 as a variable bias voltage. The resistor R1 supplies a negative gate-to-source bias for the gate terminal of the FET Q2 through the rf choke L4. The resistor R1, in setting the gate-to-source bias for the FET Q2, controls current flow through the FETs, Q1 and Q2, thereby controlling rf power amplification of the variable phase-shifting rf power amplifier 48.

In operation, an rf input signal $RF_{IN}$ of the variable phase-shifting rf power amplifier 48 is phase split in the rf power splitter 50 into rf signals that are phase shifted by 0 and 90 degrees, are amplified in the FETs Q1 and/or Q2 in selected proportions, and are combined in the rf power combiner 52 to provide a power amplified rf output, at an rf output terminal $RF_{OUT}$, that is selectively phase shifted.

Assuming a 10.0 volt dc source, if the proportioning voltage $V_P$ is lowered to 0.0 volts dc by the proportioning control 54, 10.0 volts dc will be applied across the FET Q1, and 0.0 volts dc will be applied across the FET Q2. Since the gain of FETs, such as the FETs Q1 and Q2, is approximately a linear function of the drain-to-source voltage, an rf output of the FET Q1 will be at maximum gain while an rf output of the FET Q2 will be at minimum gain.

At this time, the in-phase power combiner 52 will output half of the rf power to the rf output $RF_{OUT}$ and half of the rf power to the internal or external load. More importantly, the half delivered to the rf output terminal $RF_{OUT}$ will be in phase with a first rf signal at an upper rf output terminal 56 of the quadrature power splitter 50, that is disregarding inversion of the FET Q1.

If the proportioning voltage $V_P$ is now raised to 10.0 volts dc by the proportioning control 54, 0.0 volts dc will be applied across the FET Q1, and 10.0 volts dc will be applied across the FET Q2. The FET Q1 will now be at minimum gain, while the FET Q2 will be at maximum gain. In this case, the output of the rf in-phase power combiner 52 will be in phase with a second rf signal at a lower rf output terminal 58 of the quadrature power splitter 50. That is, the phase will have been shifted 90 degrees. Again, half of the power is delivered to the rf output $RF_{OUT}$, and half is delivered to the internal or external load.

If the proportioning voltage $V_P$ is set to 5.0 volts dc by the proportioning control 54, 5.0 volts dc will be applied across both the FET Q1 and the FET Q2, and both FETs will operate at half gain. In this case, an upper rf input terminal 60 and a lower rf input terminal 62 to the rf in-phase power combiner 52 will be equal in amplitude but 90 degrees out of phase.

At this time, the rf output $RF_{OUT}$ of the rf in-phase power combiner 52 remains at half power but is 45 degrees out of phase with the upper rf input terminal 60. As before, half of the power will be delivered to the internal or external load.

Thus, it can be seen that the proportioning control 54 is effective to shift the phase of the variable phase-shifting rf power amplifier 48, at the rf output $RF_{OUT}$, monotonically, and with reasonable linearity, from 0 to 90 degrees as the proportioning voltage is varied from 0.0 volts dc to 10.0 volts dc.

Finally with regard to FIG. 6, alternately, instead of the quadrature power splitter 50 and the rf in-phase power combiner 52, an in-phase splitter and a quadrature combiner may be used.

Figure 7:
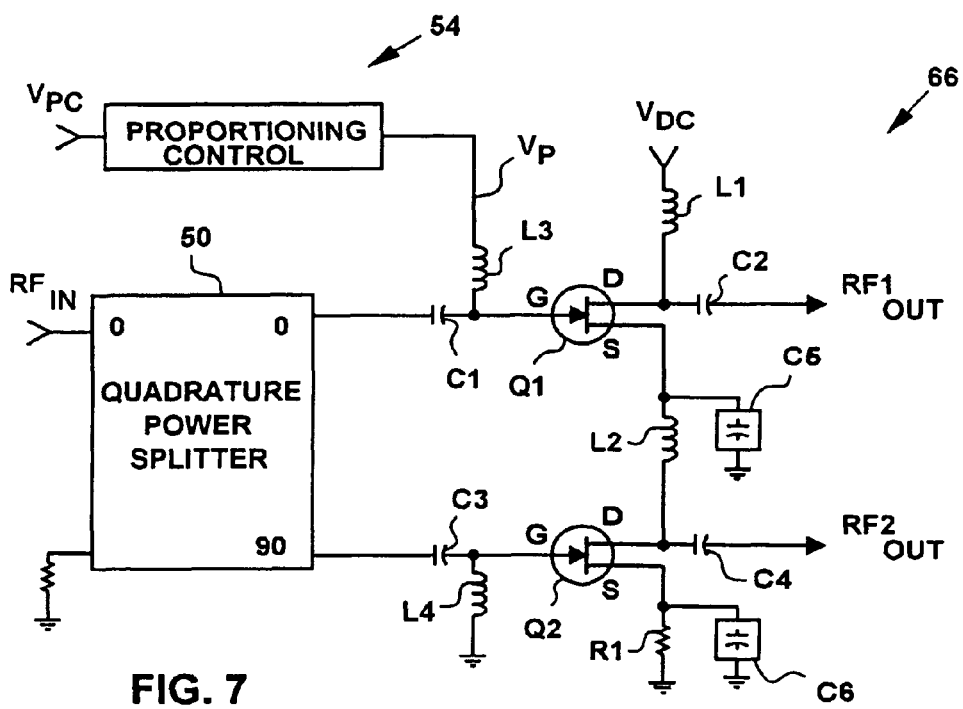
FIG. 7 is a power-shifting rf amplifier, electronic apparatus, or a shared-current electronic system, in which two solid-state electronic devices are connected in series between higher and lower dc source voltages, in which rf signals, which may be in quadrature, are separately amplified in the solid-state electronic devices, and in which the rf power is selectively shifted and proportioned between two separate rf outputs in response to a proportioning voltage.

Referring now to FIG. 7, a power-shifting rf amplifier, electronic apparatus, or shared-current electronic system, 66 includes like-named and like-numbered parts as shown and described in conjunction with FIG. 6, except that the in-phase combiner 52 has been omitted, so the power-shifting rf amplifier 66 has two rf outputs, $RF1_{OUT}$ and $RF2_{OUT}$.

Therefore, operation of the power-shifting rf amplifier 66 of FIG. 7 is the same as described for the phase-shifting rf power amplifier 48 of FIG. 6, except that the rf power is selectively proportioned between the rf outputs, $RF1_{OUT}$ and $RF2_{OUT}$, in response to a variable proportioning voltage $V_P$ that is generated by the proportioning control 54, instead of being combined into a single, phase-shifted rf output, $RF_{OUT}$, by the in-phase combiner 52 of FIG. 6.

The power-shifting amplifier 66 proportions its rf output between the rf outputs $RF1_{OUT}$ and $RF2_{OUT}$, or shifts the total rf output between the rf outputs $RF1_{OUT}$ and $RF2_{OUT}$, in response to a proportioning voltage $V_P$, and in accordance with both a magnitude of the proportioning voltage $V_P$ and a rate of change thereof. The proportioning voltage $V_P$ is generated and supplied by the proportioning control 54. The proportioning voltage $V_P$, as applied to the gate terminal of the FET Q1, is effective to control gains of both FETs Q1 and Q2 as described in conjunction with the phase-shifting rf amplifier 48 of FIG. 6.

In addition to being able to shift any percentage of the rf output from one rf output, $RF1_{OUT}$ or $RF2_{OUT}$, to the other, by varying the proportioning voltage $V_P$ both rapidly and with a sufficient change in the proportioning voltage $V_P$, the rf output power can be switched almost instantaneously from one of the rf outputs, $RF1_{OUT}$ or $RF2_{OUT}$, to the other.

The proportioning control 54 of FIGS. 6 and 7 represents any means for providing the proportioning voltage $V_P$ for use as variable gate voltages. While the proportioning voltage $V_P$ controls a phase angle of the rf output $RF_{OUT}$ of the phase-shifting rf amplifier 48 of FIG. 6, the proportioning voltage $V_P$ selectively shifts rf output power from the rf output $RF1_{OUT}$ to the rf output $RF2_{OUT}$ of the power-shifting rf amplifier 66 of FIG. 7.

Therefore, it becomes apparent that whereas the rf amplifier 10 of FIG. 1 fixedly proportions the dc source voltage between, or among, solid-state electronic devices, the phase-shifting rf amplifier 48 of FIG. 6 and the power-shifting rf amplifier 66 of FIG. 7 both variably proportion the dc source voltage between, or among, the solid-state electronic devices.

Even as the phase-shifting rf amplifier 48 of FIG. 6 maintains substantially constant rf power during phase shifting, the power-shifting rf amplifier 66 of FIG. 7 maintains a total rf output of the two rf outputs, $RF1_{OUT}$ and $RF2_{OUT}$, that is substantially constant whether the rf output is progressively shifted or switched almost instantaneously.

Since the rf input signal, $RF_{IN}$, has been split by the quadrature power splitter 50, quadrature rf signals are supplied to the gate terminals of the FETs Q1 and Q2, and the rf outputs $RF1_{OUT}$ and $RF2_{OUT}$ are in quadrature. But, if an in-phase splitter is substituted for the quadrature power splitter 50, the two rf outputs $RF1_{OUT}$ and $RF2_{OUT}$ will be in phase.

Figure 8:
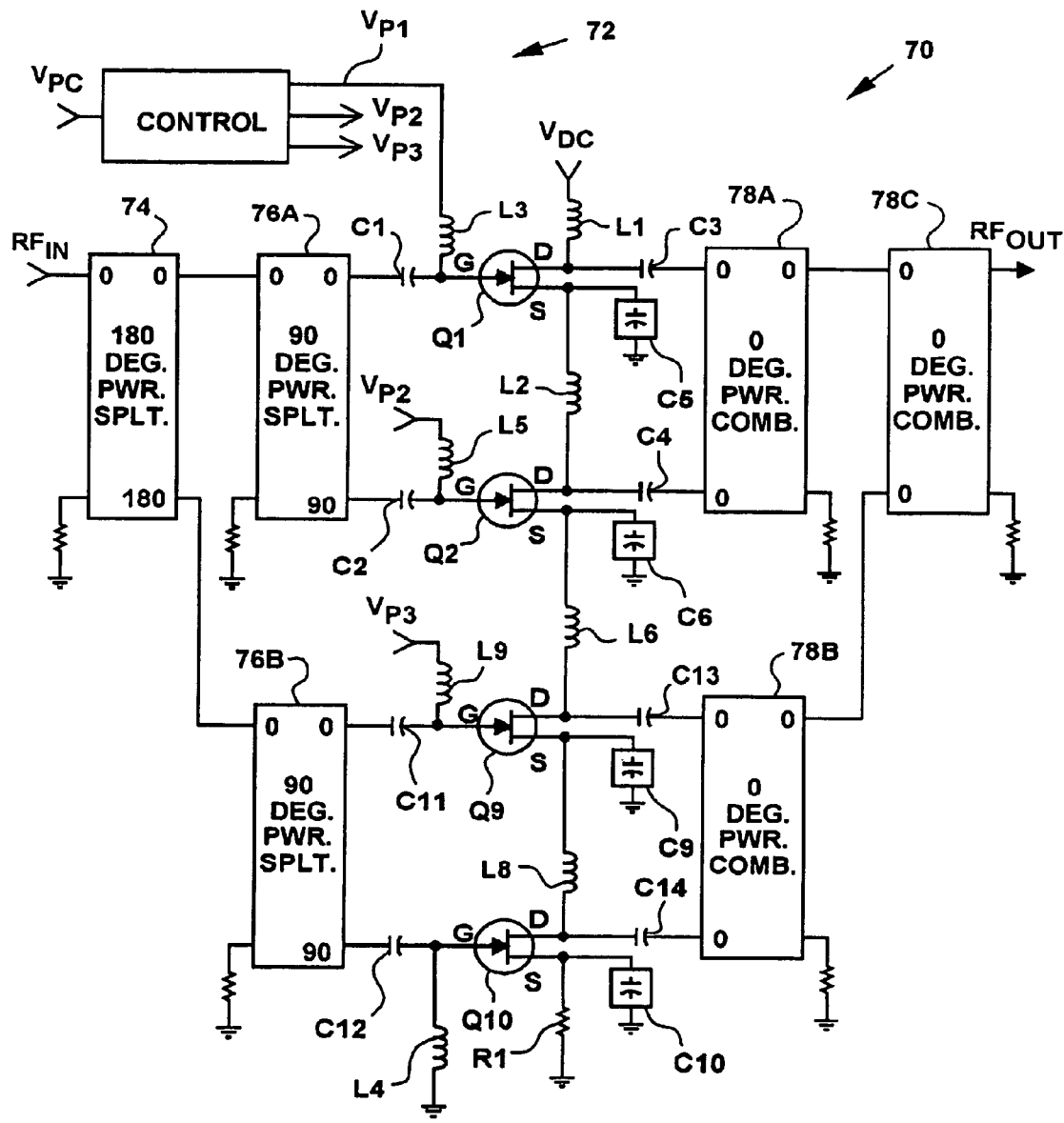
FIG. 8 is a variable phase-shifting rf power amplifier, or a shared-current electronic system, in which four FETs are connected in series with a dc source voltage to utilize the dc source voltage in variably selected proportions, and in which a phase angle of an rf output can be shifted up to 270 degrees, proportional to, and substantially linear with, a proportioning control voltage and three proportioning voltages that are generated by a proportional control of FIG. 11 that is an integral part of the variable phase-shifting rf power amplifier of FIG. 8.

Referring now to FIG. 8, a variable phase-shifting rf power amplifier, electronic apparatus, or shared-current electronic system, 70 has a phase-shift range of 270 degrees, as opposed to 90 degrees for the variable phase-shifting rf power amplifier 48 of FIG. 6. The variable phase-shifting rf power amplifier 70 includes a proportioning control 72 that generates variable proportioning voltages $V_{P1}$, $V_{P2}$, and $V_{P3}$ in response to a proportioning control voltage $V_{PC}$. Construction of the proportioning control 72 is described in conjunction with FIG. 11.

The variable phase-shifting rf power amplifier 70 includes a 180 degree power splitter 74, a 90 degree power splitter 76A, a 90 degree power splitter 76B, solid-state amplifying devices, solid-state electronic devices, field-effect transistors, or FETs, Q1, Q2, Q9, and Q10, and 0 degree power combiners 78A, 78B, and 78C. The phase-shifting rf amplifier 70 also includes rf chokes L1, L2, L3, L4, L5, L6, L8, and L9, coupling capacitors C1, C2, C3, C4, C11, C12, C13, and C14, decoupling capacitors C5, C6, C9, and C10, and the resistor R1. As shown in FIG. 8, the FETs, Q1, Q2, Q3, and Q4, are connected in dc series between a positive dc source voltage $V_{DC}$, and an electrical ground.

The 180 degree power splitter 74 of FIG. 8 phase splits the rf input signal $RF_{IN}$ into 0 and 180 degree phase-shifted rf signals, and the 90 degree power splitter 76A, which is connected to the 0 degree output of the 180 degree power splitter 74, splits its output into 0 and 90 degree rf signals, so that 0 and 90 degree phase-shifted rf signals are provided by the 90 degree power splitter 76A at 0 and 90 degree outputs, respectively; and a 180 degree phase-shifted rf signal is provided at the 180 degree output of the 180 degree power splitter 74.

Also, as shown in FIG. 8, the 180 degree output of the 180 degree power splitter 74 is connected to the input of the 90 degree power splitter 76B, so that the output at the 0 degree output of the 90 degree power splitter 76B is not shifted additionally, but remains at 180 degrees. However, the other rf output of the 90 degree power splitter 76B is phase shifted an additional 90 degrees from that of the 180 degree output of the 180 degree power splitter 74, to 270 degrees.

Figure 9:
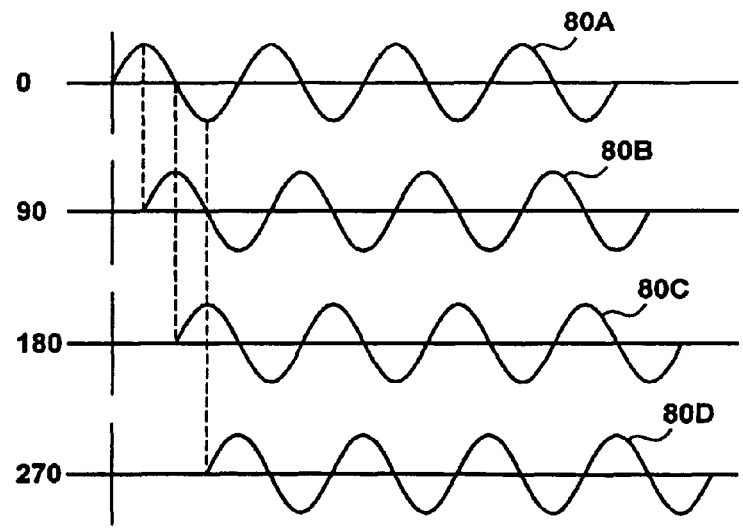
FIG. 9 illustrates sine waves that are phase shifted, respectively, by 0, 90, 180, and 270 degrees in the phase-shifting rf power amplifier of FIG. 8.

Referring now to FIGS. 8 and 9, an rf signal 80A of FIG. 9 that is not phase shifted is provided by the 0 degree output of the 90 degree power splitter 76A, an rf signal 80B that is phase shifted 90 degrees is provided at the 90 degree output of the 90 degree power splitter 76A, an rf signal 80C that is phase shifted by 180 degrees is provided at the 0 degree output of the 90 degree power splitter 76B, and an rf signal 80D that is phase shifted 270 degrees is provided at the 90 degree output of the 90 degree power splitter 76B.

Assuming a 10.0 volts dc source, if proportioning voltages, $V_{P1}$, $V_{P2}$, and $V_{P3}$, are all at 0.0 volts dc, 10.0 volts dc will be applied across the FET Q1, and 0.0 volts dc will be applied across the FETs Q2, Q9, and Q10. Since the gain of the FETs, Q1, Q2, Q9, and Q10 is approximately a linear function of the applied voltage from drain to source, the FET Q1 will be at maximum gain while the FETs Q2, Q9, and Q10 will be at minimum gain. The rf output $RF_{OUT}$ will then be at 0 degrees relative to the rf input signal $RF_{IN}$, that is disregarding inversion of the FET Q1.

If the proportioning voltage $V_{P1}$ is now raised to 10.0 volts dc and the proportioning voltages $V_{P2}$ and $V_{P3}$ remain at 0.0 volts dc, 10.0 volts dc will be applied across the FET Q2, and 0.0 volts dc will be applied across the FETs Q1, Q9, and Q10. The FET Q2 will now be at maximum gain while the FETs Q1, Q9, and Q10 will be at minimum gain. In this case, the rf output $RF_{OUT}$ will be at 90 degrees relative to the rf input signal $RF_{IN}$, again disregarding inversion of the FET Q2.

Similarly, if the proportioning voltage $V_{P1}$ is at 5.0 volts dc, and the proportioning voltages $V_{P2}$ and $V_{P3}$ are at 0.0 volts dc, the rf output $RF_{OUT}$ will be at 45 degrees relative to the rf input signal $RF_{IN}$. By properly selecting the proportioning voltages $V_{P1}$, $V_{P2}$, and $V_{P3}$, the phase of the phase-shifting rf power amplifier 70 can be made to vary monotonically and reasonably linearly from 0 degrees to 270 degrees. Optionally, the splitters and combiners can be at phase angles other than 0 degrees, 90 degrees, and 180 degrees.

Figure 10:
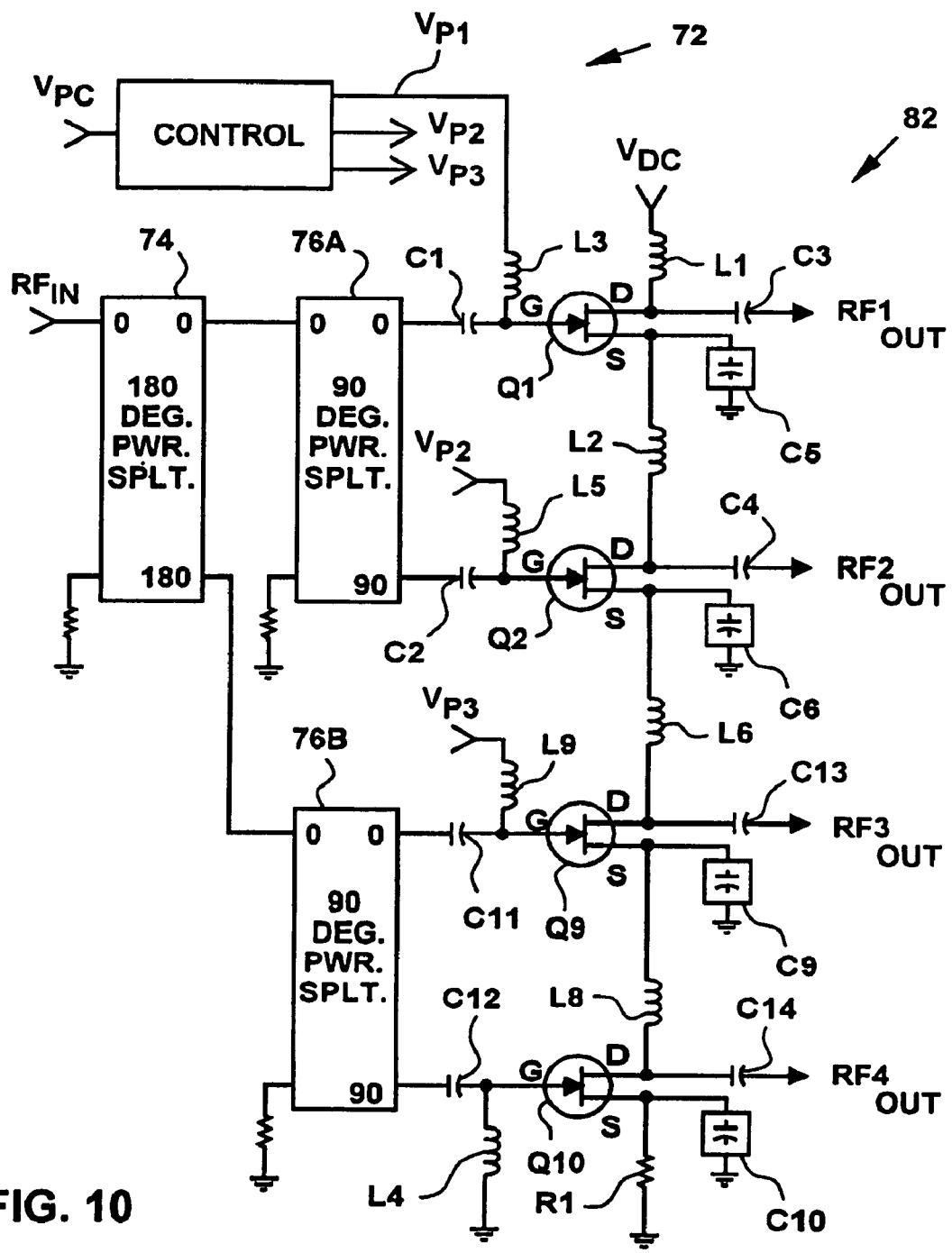
FIG. 10 is a variable power-shifting rf amplifier, or power-switching amplifier, in which four solid-state electronic devices are connected in series between higher and lower dc source voltages or supply voltages to utilize the dc source voltage in variably selected proportions, in which 0, 90, 180, and 270 degree rf signals are separately amplified in the four solid-state electronic devices, and the rf power is selectively proportioned, or selectively switched, among four rf outputs in response to the three proportioning voltages that are generated by the proportioning control, of FIG. 11, that is an integral part of the power-shifting rf amplifier of FIG. 10.

Referring now to FIG. 10, a variable power-shifting rf amplifier, or power-switching amplifier, 82 includes like-named and like-numbered parts as shown and described in conjunction with the phase-shifting rf amplifier 70 of FIG. 8, including the proportioning control 72, except that the power combiners 78A, 78B, and 78C have been omitted, thereby providing four rf outputs, $RF1_{OUT}$, $RF2_{OUT}$, $RF3_{OUT}$, and $RF4_{OUT}$.

The power-shifting rf amplifier 82 will selectively and progressively shift, or abruptly switch, power between/among the rf outputs $RF1_{OUT}$, $RF2_{OUT}$, $RF3_{OUT}$, and $RF4_{OUT}$ in response to proportioning voltages $V_{P1}$, $V_{P2}$, and $V_{P3}$.

The proportioning control 72 produces the proportioning voltages $V_{P1}$, $V_{P2}$, and $V_{P3}$ in response to the proportioning control voltage $V_{PC}$. The rf output $RF2_{OUT}$ is at 90 degrees to the rf output $RF1_{OUT}$, the rf output $RF3_{OUT}$ is at 180 degrees to the rf output $RF1_{OUT}$, and the rf output $RF4_{OUT}$ is at 270 degrees to the rf output $RF1_{OUT}$.

Figure 11:
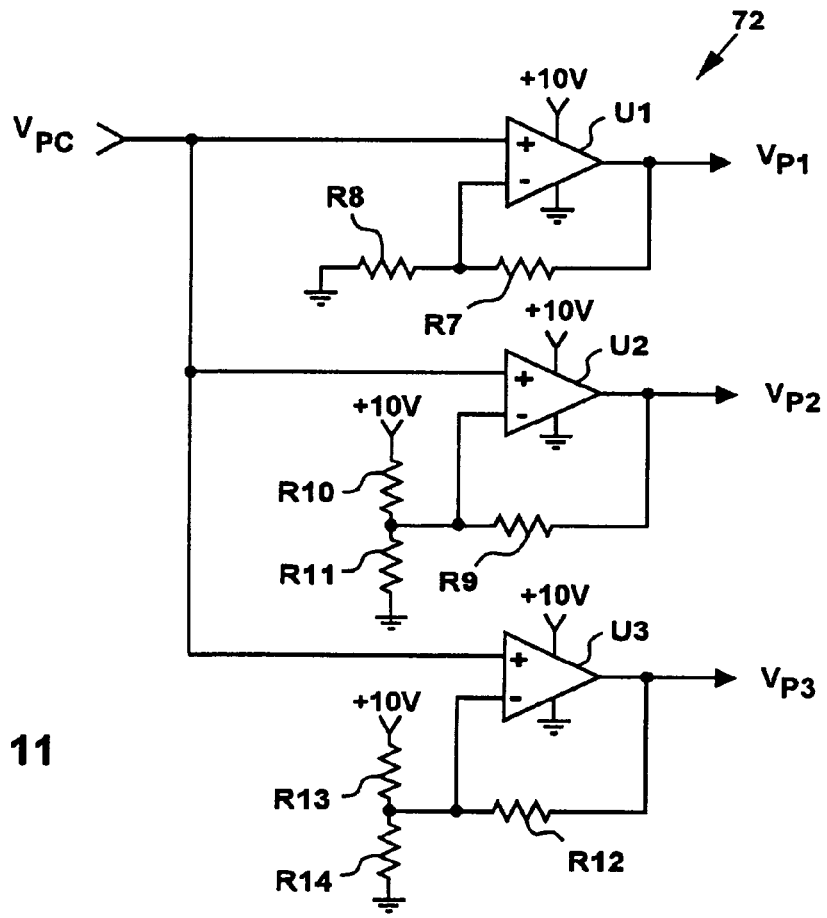
FIG. 11 is the proportioning control that is an integral part of both the variable phase-shifting rf power amplifier of FIG. 8 and the power-shifting rf amplifier of FIG. 10, and that generates the three proportioning voltages, in response to a proportioning-control voltage, for controlling both the phase-shifting rf power amplifier of FIG. 8 and the power-shifting rf amplifier of FIG. 10.

Referring now to FIG. 11, the proportioning control 72, which is included in the embodiments of FIGS. 8 and 10, includes amplifiers U1, U2, and U3 which are rail-to-rail operational amplifiers. In addition, the proportioning control 72 includes resistors R7, R8, R9, R10, R11, R12, R13, and R14 that set the gain of the amplifiers, U1, U2, and U3, to be 4. Resistances of the resistors R7, R8, R9, R10, R11, R12, R13, and R14 preferably are 30K, 10K, 30K, 30K, 15K, 30K, 15K and 30K, respectively, but all may be at resistances that are any reasonable multiple or fraction thereof.

Assuming a 10.0 volts dc source, the amplifiers, U1, U2, and U3, are biased to start amplifying at proportioning voltages $V_P$ of 0.0, 2.5, 5.0, 7.5, and 10.0 volts respectively.

In response to a proportioning control voltage $V_{PC}$ of 0.0 volts, the proportioning control 72 produces proportioning voltages, $V_{P1}$, $V_{P2}$, and $V_{P3}$, of 0.0 volts dc. In response to increases in the proportioning control voltage $V_{PC}$, the proportioning voltage $V_{P1}$ increases to 10.0 volts while keeping the proportioning voltages $V_{P2}$ and $V_{P3}$ at 0.0 volts dc.

With further increases in the proportioning control voltage $V_{PC}$, when the proportioning voltage $V_{P1}$ reaches 10.0 volts dc, it remains at this level, while the proportioning voltage $V_{P2}$ increases from 0.0 volts to 10.0 volts dc. In like manner, after the proportioning voltages, $V_{P1}$ and $V_{P2}$, both reach 10.0 volts dc, they remain at 10.0 volts dc while additional increases in the proportioning control voltage $V_{PC}$ increase the proportioning voltage $V_{P3}$ from 0.0 to 10.0 volts dc.

Although a detailed construction has been shown and described, the proportioning control 72 is representative of any device, analog or digital, that will produce the proportioning voltages $V_{P1}$, $V_{P2}$, and $V_{P3}$ in response to an analog or digital input, vary the proportioning voltages $V_{P1}$, $V_{P2}$, and $V_{P3}$ in whatever manner is useful for a particular application, and vary them in whatever time frame may be desirable or suitable for an intended use in either the phase-shifting rf amplifier 70 of FIG. 8 or the power-shifting rf amplifier 82 of FIG. 10.

Gains of the FETs Q1, Q2, Q9, and Q10 are selectively varied by varying the proportioning voltages $V_{P1}$, $V_{P2}$, and $V_{P3}$, and applying them to the gates of the FETs Q1, Q2, and Q9. As the proportioning voltages $V_{P1}$, $V_{P2}$, and $V_{P3}$ are selectively varied, the rf output is selectively shifted/proportioned among rf outputs $RF1_{OUT}$, $RF2_{OUT}$, $RF3_{OUT}$, and $RF4_{OUT}$.

Thus it can be seen that the phase-shifting rf amplifier 48, the phase-shifting rf amplifier 70, the power-shifting rf amplifier 66, and the power-shifting rf amplifier 82 all selectively proportion the dc source voltage between, or among, solid-state electronic devices, whether they be J-FETs, such as GaAsFETs, MOSFETs, bipolar-junction transistors, or any other electronic device.

Figure 12:
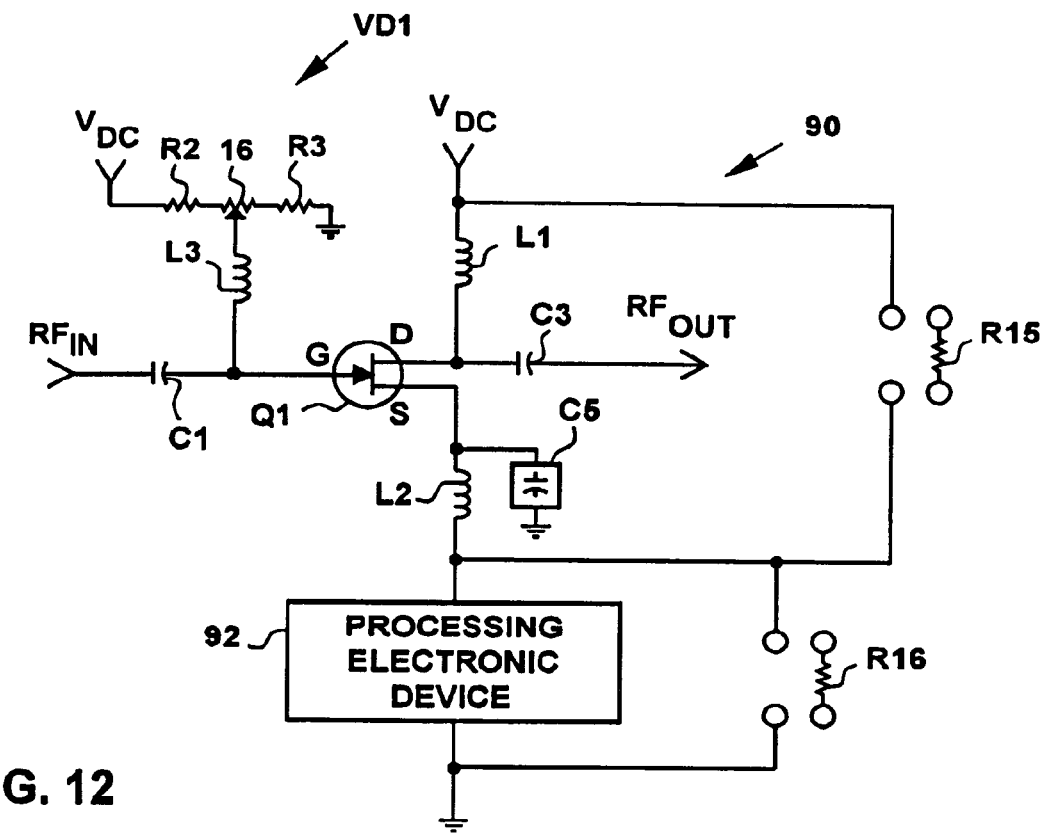
FIG. 12 is a shared-current electronic system in which an n-channel GaAsFET is connected in dc series with a processing electronic device.

Referring now to FIG. 12, a shared-current electronic system, or shared-current electronic apparatus, 90 includes like-named and like-numbered parts as those of FIG. 1, except that the GaAsFET Q2, with its associated parts, is omitted, and the GaAsFET Q1 is connected in series with a processing electronic device 92, between the positive dc source voltage $V_{DC}$ and a ground.

The processing electronic device 92 may be any collection or assembly of electronic devices, such as a baseband processor, that provides a desired electronic function. While no input or output communication has been shown between the GaAsFET Q1 and the processing electronic device 92, any suitable connections may be made, to provide any suitable relationship therebetween.

Additional components of the shared-current electronic system 90 are the same as shown and described in conjunction with FIG. 1, except that the power splitter 12 has been omitted, the power combiner 14 has been omitted, and shunt resistors R15 and R16 have been added.

If a current flow requirement for the processing electronic device 92 is greater than that of the GaAsFET Q1, then the resistor R15 can be connected to shunt current around the GaAsFET Q1. Or, if the current flow requirement for the GaAsFET Q1 is greater than that of the processing electronic device 92, then the resistor R16 can be connected to shunt current flow around the processing electronic device 92.

Figure 13:
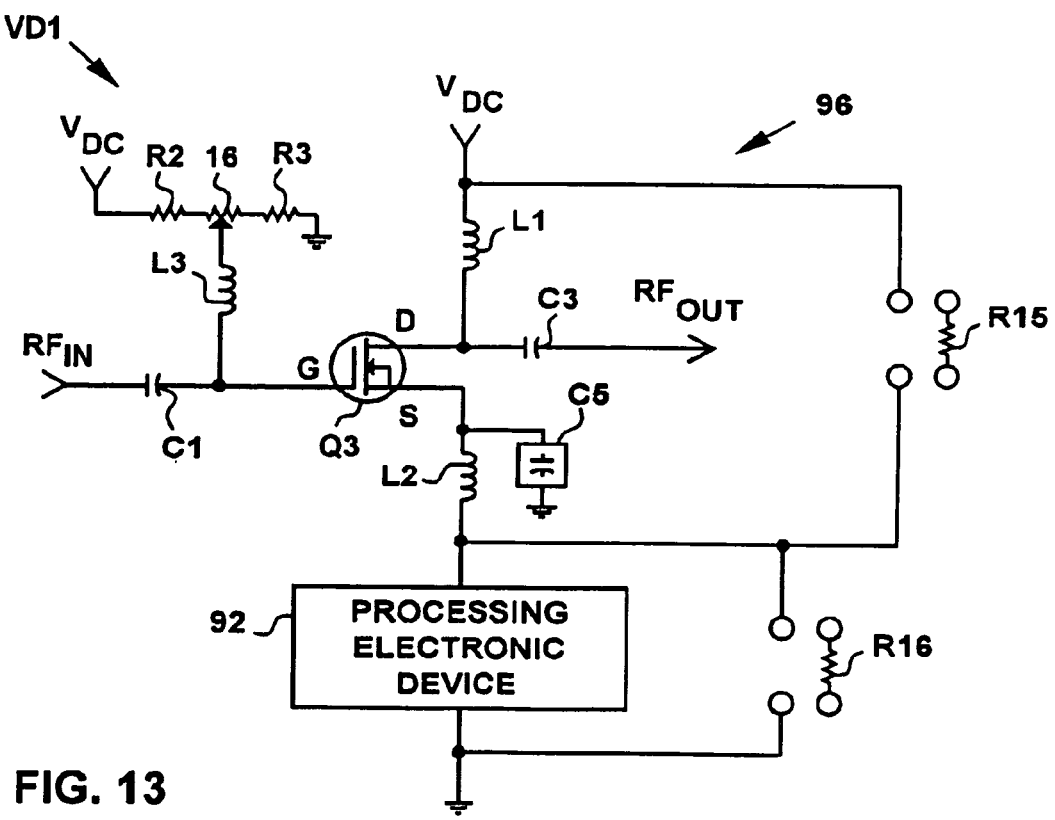
FIG. 13 is a shared-current electronic system in which an n-channel MOSFET is connected in dc series with the processing electronic device of FIG. 12.

Referring now to FIG. 13, a shared-current electronic system, or shared-current electronic apparatus, 96 includes like-named and like-numbered parts as those of FIG. 12, except that the GaAsFET Q1 has been replaced by the MOSFET Q3, which is connected in series with the processing electronic device 92, between a positive dc source voltage $V_{DC}$ and a ground. Operation is as described for FIG. 12.

Figure 14:
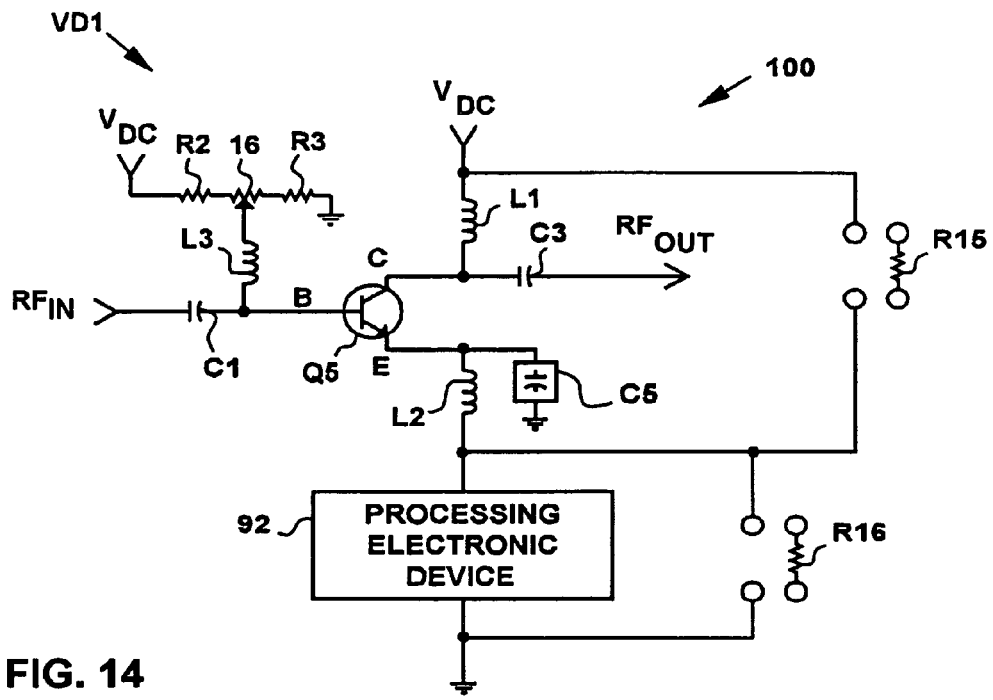
FIG. 14 is a shared-current electronic system in which an npn bipolar-junction transistor is connected in dc series with the processing electronic device of FIGS. 12 and 13.

Referring now to FIG. 14, a shared-current electronic system, or shared-current electronic apparatus, 100 includes like-named and like-numbered parts as those of FIG. 12, except that the GaAsFET Q1 has been replaced by the bipolar-junction transistor Q5, which is connected in series with the processing electronic device 92, between a positive dc source voltage $V_{DC}$ and a ground. Operation is as described for FIGS. 12 and 13.

Figure 15:
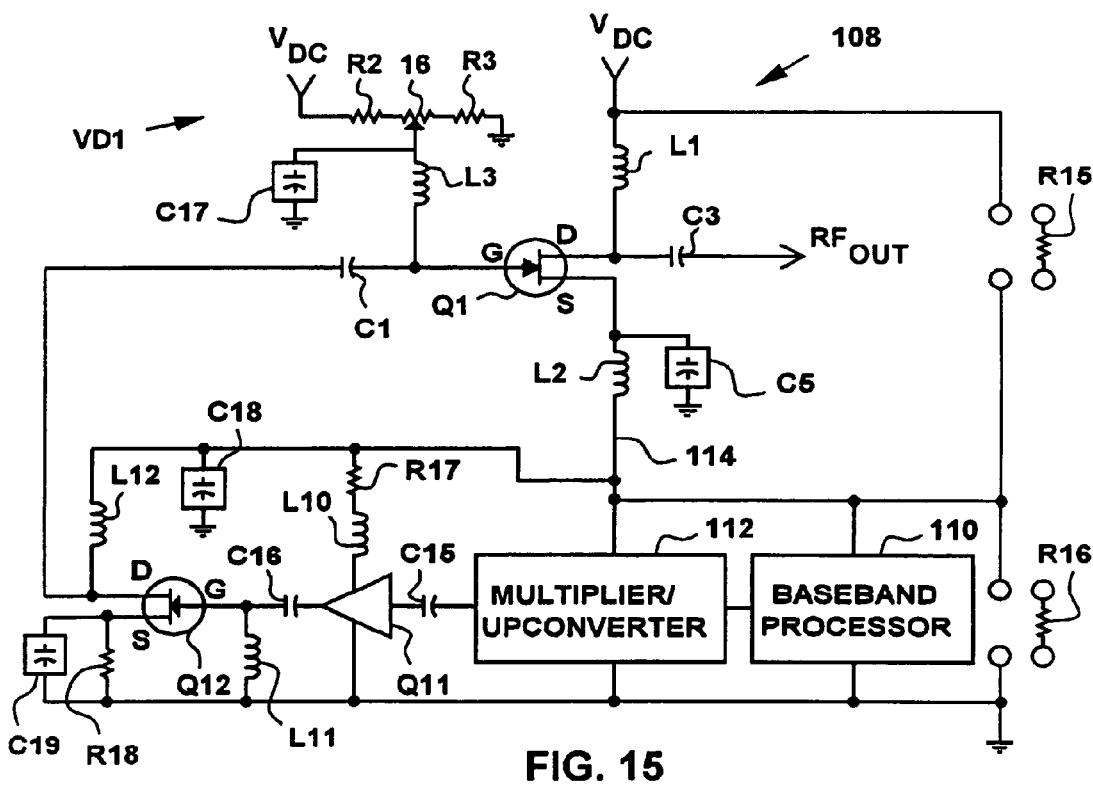
FIG. 15 is a frequency-compression electronic system, or a shared-current electronic system, in which an rf output GaAsFET shares current with a baseband processing device, a multiplier/up-converter, a gain block, and a driver GaAsFET.
Figure 16:
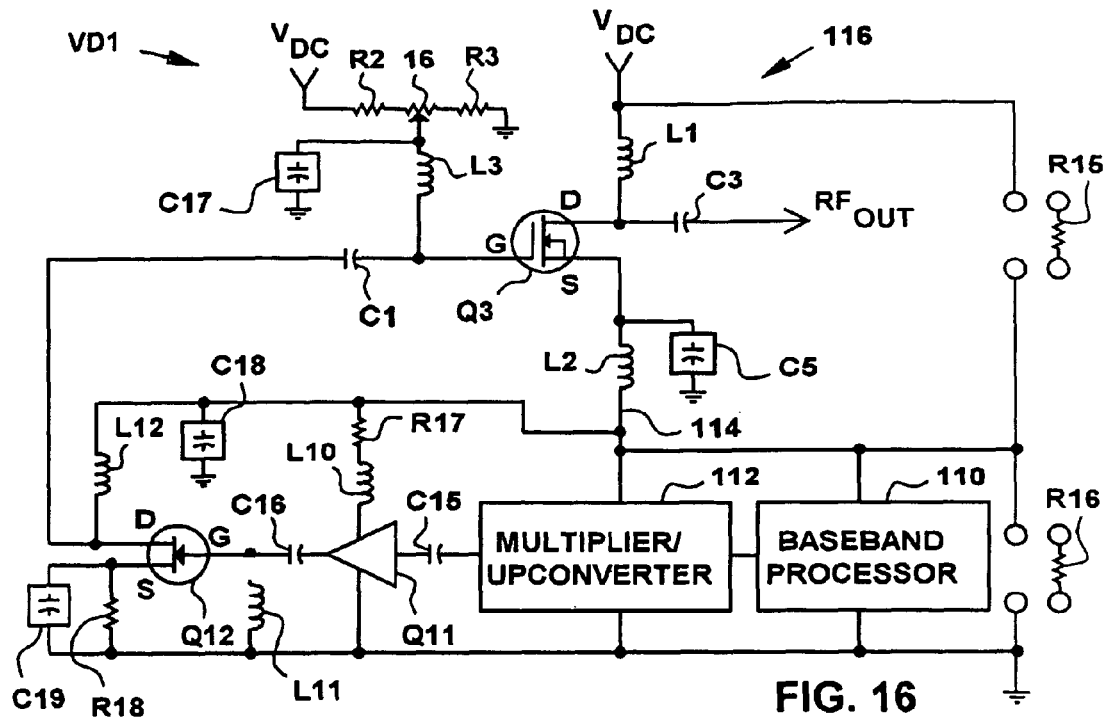
FIG. 16 is a frequency-compression electronic system, or a shared-current electronic system, in which the rf output GaAsFET of FIG. 15 is replaced by a MOSFET.
Figure 17:
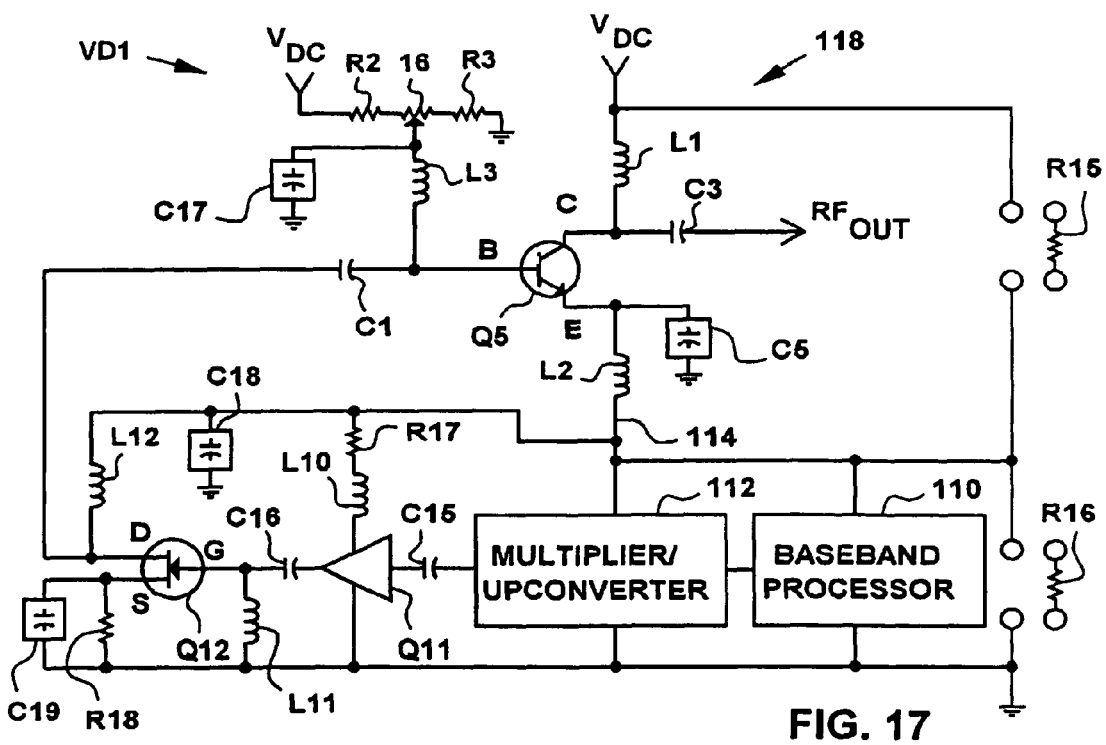
FIG. 17 is a frequency-compression electronic system, or a shared-current electronic system, in which the rf output GaAsFET of FIG. 15 is replaced by a bipolar-junction transistor.

FIGS. 15-17 are spectrally-efficient digital modulation systems that utilize the shared-current principle of the present patent application. Various spectrally-efficient digital modulation systems have been developed for the purpose of transmitting more data in a given bandwidth. Among the various modulation systems are the PCM/FM waveform (Tier 0), the shaped-offset QPSK waveform (SOQPSK, Tier I) which doubles the quantity of data that can be transmitted in a given bandwidth, and the multi-h CPM waveform (Tier II) that compresses three times more data in a given bandwidth than the PCM/FM waveform. While the multi-h CPM waveform excels in spectral efficiency, the demodulator is extremely complex and expensive.

While the frequency-compression systems of FIGS. 15-17, and the current-sharing principles thereof, will generate PCM/FM and multi-h CPM waveforms with suitable software, the emphasis herein is on SOQPSK waveforms which provide outstanding gains in spectral efficiency without the complexity and expense that is associated with demodulating the multi-h CPM waveform.

The SOQPSK waveform was invented by Terrance J. Hill. He taught this waveform in his article entitled: *An Enhanced, Constant Envelope, Interoperable Shaped Offset QPSK (SO-*

*QPSK) Waveform for Improved Spectral Efficiency*, published in the Proceedings of the International Telemetering Conference in San Diego, Calif. on October 2000.

As noted above, SOQPSK is a high-spectral efficiency method of modulation that compresses more data into a given bandwidth than conventional methods of modulation. Unfortunately, from a power-consumption standpoint, it is highly inefficient. However, power efficiency is increased tremendously by sharing current of the SOQPSK components with the GaAsFET Q1 that produces the rf output. The power efficiency is further improved by sharing the current flow of the GaAsFET Q1 with a gain block Q11. The gain block Q11, is a solid-state amplifying device, or solid-state electronic device.

In a typical 5.0 watt SOQPSK system, it takes 1.2 amperes at 6.5 volts to generate a bandwidth compressed carrier at a center frequency, and the final 5.0 watt amplifier draws about 1.5 amperes from a 12.0 volt dc source voltage. In prior art SOQPSK systems, operating voltages for both generation of the SOQPSK carrier and the final amplifier are separately provided from an 18.5 volts dc source through linear regulators, thereby resulting in a large percentage of power being lost in voltage regulation. And the total current requirement is 1.2+1.5=2.7 amperes. In contrast, the SOQPSK systems of the present invention share the current for both bandwidth generation and final amplification, so the total current flow for the present invention is only 1.5 amperes. Therefore, a much higher overall efficiency is achieved by the present invention.

Referring now to FIG. 15, a SOQPSK system, shared-current electronic system, or shared-current electronic apparatus, 108, includes a baseband processor, baseband processing device, or processing electronic device, 110, a multiplier/up-converter, or processing electronic device, 112 and two solid-state amplifying devices, or solid-state electronic devices, Q11 and Q12 that are connected in dc parallel with each other, so that the total current used by these four electronic devices flows through a conductor 114. The electronic device Q11 is a gain block (a chip that includes two bipolar-junction transistors), and the electronic device Q12 is a GaAsFET that is used as a driver for the FET Q1.

The electronic devices, Q11 and Q12, provide preamplification for the FET Q1 that produces the rf output $RF_{OUT}$. While the gain block Q11 and the GaAsFET Q12 have been shown, any mixture of solid-state devices, such as gain blocks, BJTs, J-FETs, or MOSFETs, can be used for preamplification, as long as proper bias is provided.

In addition to the variable voltage divider VD1, the GaAsFET Q1, the coupling capacitors C1 and C3, the decoupling capacitor C5, and the rf chokes L1, L2, and L3 of FIG. 1, the SOQPSK system 108 also includes resistors R15, R16, R17, and R18, rf chokes L10, L11, and L12, coupling capacitors C15 and C16, decoupling capacitors C17, C18, and C19, and the conductor 114.

Not only are the baseband processor 110, the multiplier/up-converter 112, the gain block Q11, and the GaAsFET Q12 all in dc parallel, they are also all in dc series with the FET Q1. Therefore, the baseband processor 110, the multiplier/up-converter 112, the gain block Q11, and the GaAsFET Q12 all share current to the GaAsFET Q1 through the conductor 114, thereby greatly increasing the overall power efficiency of the SOQPSK system 108.

If the GaAsFET Q1 requires less current than the total current flow of the components that are below the conductor 114, then the shunt resistor R15 can be used to increase current flow for the components below the conductor 114. Or, if the GaAsFET Q1 requires more current than the total current flow of all of the components that are below the conductor 114, then the shunt resistor R16 can be used to increase current flow for the FET Q1.

The baseband processor 110 uses a frequency command and a modulation input to create a SOQPSK modulated rf signal at about 70.0 MHz. The multiplier/up-converter 112 multiplies and then upconverts (mixes) the 70.0 MHz signal to L-band or S-band (1430.0-1540.0 MHz or 2200.0-2400.0 MHz). The drivers, consisting of the gain block Q11 and the driver GaAsFET Q12, amplify the L-band or S-band signal to a level adequate to drive the GaAsFET Q1.

Referring now to FIG. 16, a SOQPSK system, shared-current electronic apparatus, or a shared-current electronic system, 116 includes the MOSFET Q3 that is connected in dc series with the baseband processor 110 and the multiplier/up-converter 112 of FIG. 15.

Except for replacing the GaAsFET Q1 of FIG. 15 with the MOSFET Q3 of FIG. 16, and except for changes relating to providing a bias for the MOSFET Q3, the SOQPSK systems, 108 and 116, are the same. Therefore, operation of the SOQPSK system 116 can be understood by reading the description of the SOQPSK system 108 of FIG. 15.

Referring now to FIG. 17, a SOQPSK system, shared-current electronic apparatus, or a shared-current electronic system, 118 includes components as shown and described in conjunction with FIG. 15, except that the GaAsFET Q1 of FIG. 15 has been replaced with the bipolar-junction transistor Q5.

Referring finally to FIGS. 15, 16, and 17, and considering the number and types of processing electronic devices, 110, 112, Q11, and Q12, that are connected in dc parallel to each other and in series with the output power device, the GaAsFET Q1, the MOSFET Q3, or the bipolar-junction transistor Q5, it can be understood that once the source of the FET, Q1 or Q3, or the emitter of the bipolar-junction transistor Q5 is decoupled, anything that involves rf signals of the same frequency, or different frequencies, can be connected in series with the GaAsFET Q1, the MOSFET Q3, or the bipolar-junction transistor Q5, provided that the decoupling and rf choking network works for all frequencies in the system.

It follows that, although one solid-state electronic device, such as the GaAsFET Q1, has been shown with at least one processing electronic device, such as the baseband processor 110, with the solid-state electronic device nearest to the dc source voltage, the stack could be inverted with the processing electronic device nearest to the dc source voltage.

Figure 18:
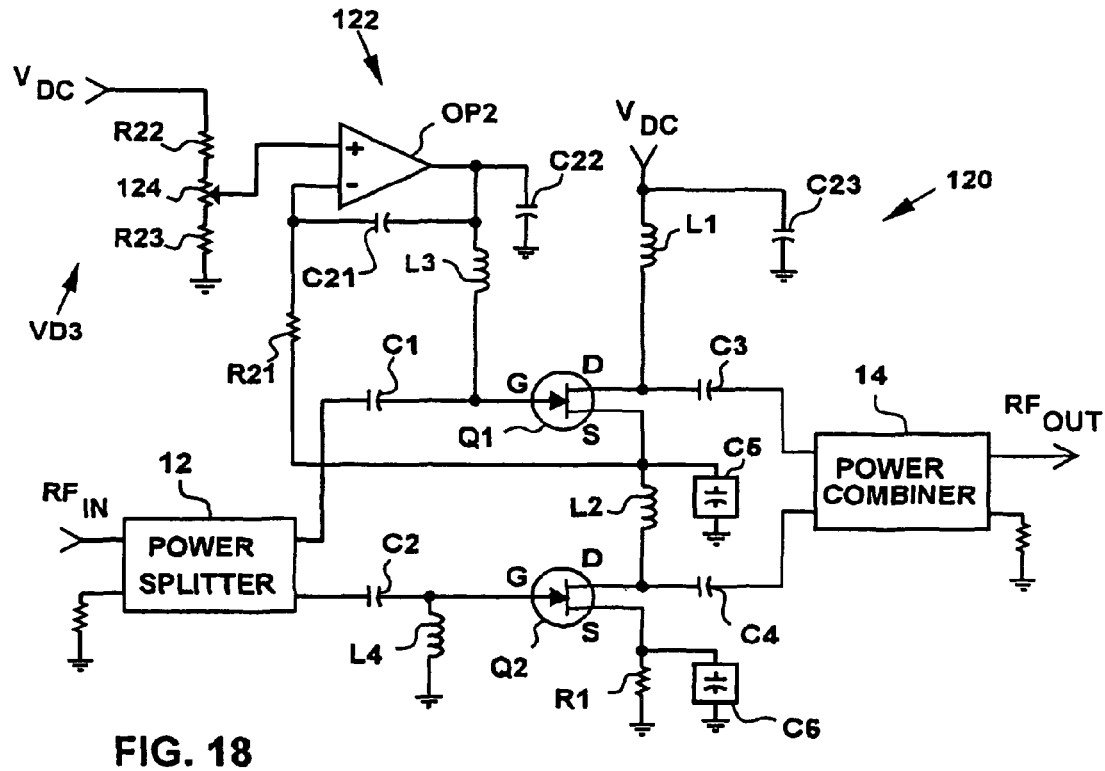
FIG. 18 is a variable phase-shifting rf amplifier, an rf power amplifier, or a shared-current electronic system, that is similar to the shared-current electronic system of FIG. 1, except that a precise proportioner precisely proportions a predetermined proportion of the dc source voltage to one of the GaAsFETs irrespective of operating parameter variations in components and/or component drift.

Referring now to FIG. 18, a phase-shifting rf amplifier, an rf power amplifier, electronic apparatus, or shared-current electronic system, 120 includes components that are like-numbered and like-named with those of the rf power amplifier, or shared-current electronic system 10 of FIG. 1, except that a precise proportioner 122 has replaced the variable voltage divider VD1 of FIG. 1.

Operation of the shared-current electronic system 120 is the same as fully described for the shared-current electronic system 10 of FIG. 1, except that the precise proportioner 122 causes a precise proportion or precise portion of the dc source voltage to be utilized in the FET Q1. This precise proportioning is irrespective to production variations in component operating parameters and subsequent drift in component operating parameters.

The precise proportioner 122 includes an operational amplifier OP2, a variable voltage divider VD3, capacitors C21 and C22, decoupling capacitor C23, and a resistor R21. The variable voltage divider VD3 includes resistors R22 and R23, and a potentiometer 124.

The variable voltage divider VD3 provides a proportioning voltage to a positive terminal of the operational amplifier OP2. The magnitude of the dc proportioning voltage that is applied to the positive terminal of the operational amplifier OP2 is selected by adjusting the potentiometer 124.

Due to the virtual short phenomena that exists between the positive and negative terminals of operational amplifiers, a dc voltage that equals the proportioning voltage on the positive terminal of the operational amplifier OP2 will appear at the negative terminal.

The operational amplifier OP2 forces its positive and negative terminals to be at the same voltage by adjusting its output voltage, which is the bias control for the gate of the GaAsFET Q1, until the lower, or source, terminal of the FET Q1 reaches a dc voltage that is equal to the dc proportioning voltage that is applied to the positive terminal of the operational amplifier OP2 by the variable voltage divider VD3, as selectively adjusted by the potentiometer 124.

The operational amplifier OP2 forces a dc voltage at its negative terminal to equal that applied to a dc proportioning voltage at its positive terminal reference level due to both the virtual short and negligible current into or out of the input and negative input terminals of the operational amplifier OP2. Therefore, there is no voltage drop across the resistor R21. However, the resistance of the resistor R21 must be high enough to appear as a near open circuit to the rf signal at the lower, or source, terminal of the FET Q1.

Even as the purpose of the rf choke L1 is to rf isolate the upper, or drain, terminal of the FET Q1 from the dc source voltage, the purpose of the rf choke L3 is to rf isolate the dc source voltage from the input, or gate, terminal of the FET Q1. The capacitor C23 is a decoupling network containing low, intermediate, and high-frequency decoupling capacitors to prevent any operational amplifier noise from modulating the FET Q1.

The capacitance of the capacitor C21 is chosen to accommodate the frequency response of the power supply VDC ramp voltage, resistances of the resistor R22 and the potentiometer 124, and device characteristics of the FET Q1. The voltage across the capacitor C21 in the steady state equals the voltage across the gate and source terminals of the FET Q1.

As described above, the potentiometer 124, by providing a selectively-adjustable proportioning voltage for the operational amplifier OP2, sets a selective and precisely regulated dc voltage at the source, or lower, terminal of the FET Q1. Therefore, since the portion of the dc source voltage utilized by the FET Q1 is the difference between the dc source voltage and the dc voltage at the lower, or source, terminal of the FET Q1, the precise proportioner 122 adjustably controls the precise portion of the dc source voltage that will be utilized in the FET Q1.

Figure 19:
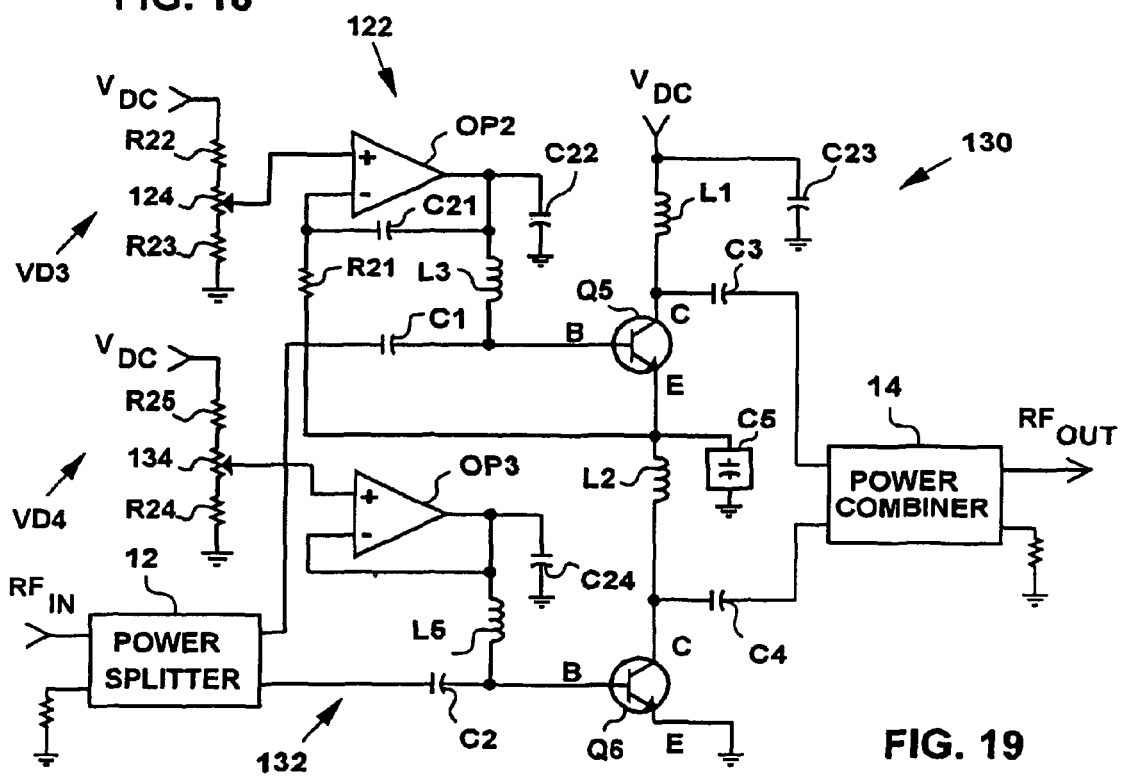
FIG. 19 is an rf power amplifier, or a shared-current electronic system, that is similar to the shared-current electronic system of FIG. 3, except that the dc source voltage is precisely proportioned to one of the bipolar-junction transistors irrespective of operating parameter variations in components and/or component drift.

Referring now to FIG. 19, a phase-shifting rf amplifier, an rf power amplifier, electronic apparatus, or shared-current electronic system, 130 includes components that are like-numbered and like-named with those of the rf power amplifier, or shared-current electronic system 26 of FIG. 3, except that the precise proportioner 122 of FIG. 18 has replaced the variable voltage divider VD1 of FIG. 3, and except that a clamped voltage divider 132 of FIG. 19 has replaced the variable voltage divider VD2 of FIG. 3 for biasing the bipolar-junction transistor Q5.

Since operation of the rf power amplifier 26 has been described in detail, and since the rf power amplifiers 26 and 130 function identically, except for precise proportioning of the dc source voltage, a detailed description of the rf power amplifier 130 is unnecessary and would be redundant.

The clamped voltage divider 132 includes an operational amplifier OP3, a variable voltage divider VD4, and a capacitor C24. The variable voltage divider VD4 includes a potentiometer 134 and resistors R24 and R25. The operational amplifier OP3 of the clamped voltage divider 132 functions as described for the precise proportioner 122. That is, the operational amplifier OP3 forces a dc voltage, as selected by the potentiometer 134 and as applied to the positive input terminal, to also appear at its input terminal. Therefore, the operational amplifier OP3 clamps a bias voltage, as selected by the potentiometer 134, to remain constant without regard to bias current drawing by the transistor Q6.

While the clamped voltage divider 132 serves a useful purpose in regulating the bias voltage for the transistor Q6, it should be recognized that it is the precise proportioner 122 that controls the portion of the dc source voltage that is applied to of the transistor Q5 irrespective of manufacturing variations in operating parameters of either the transistor Q5 or the transistor Q6, and irrespective of drift in the operating parameters of either the transistors, Q5 or Q6.

Figure 20:
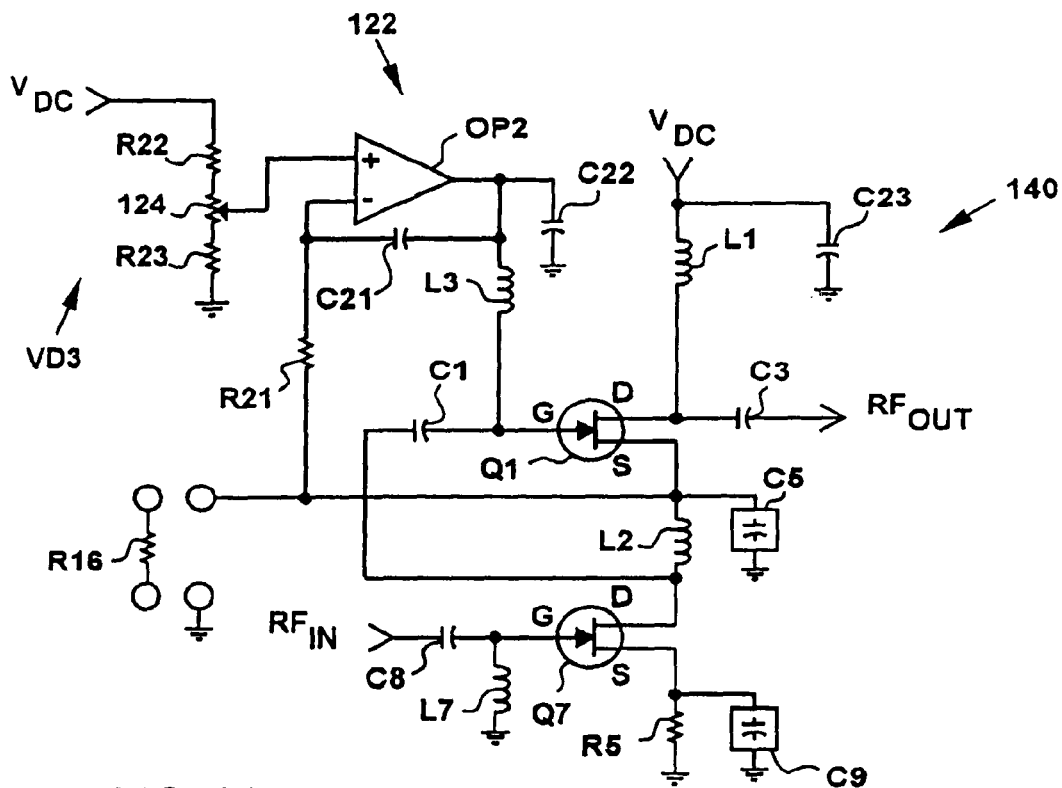
FIG. 20 is an rf power amplifier, or a shared-current electronic system in which two gallium arsenide FETs are connected in dc series and also in rf series, and the dc source voltage is precisely proportioned to one of the GaAsFETs irrespective of operating parameter variations in components and/or component drift.

Referring now to FIG. 20, an rf power amplifier, electronic apparatus, or shared-current electronic system, 140 includes solid-state electronic devices, GaAsFETs, or FETs Q1 and Q7, decoupling capacitors C5 and C9, coupling capacitors C1, C3, and C8, rf chokes L1, L2, L5, and L7, resistors R5 and R16, and the precise proportioner 122.

An rf signal that is inputted at $RF_{IN}$, is amplified in the FET Q7, and the amplified output of the FET Q7, at the source terminal thereof, is used to drive the FET Q1 by connection to the gate terminal thereof. Since the power output of the FET Q1, and the current drain of the FET Q1, will be greater than the power and current drain of the FET Q7, the resistor R16 is connected to the source terminal of the FET Q1, around the FET Q7, to the electrical ground, thereby providing the required increase in current flow through the FET Q1.

Figure 21:
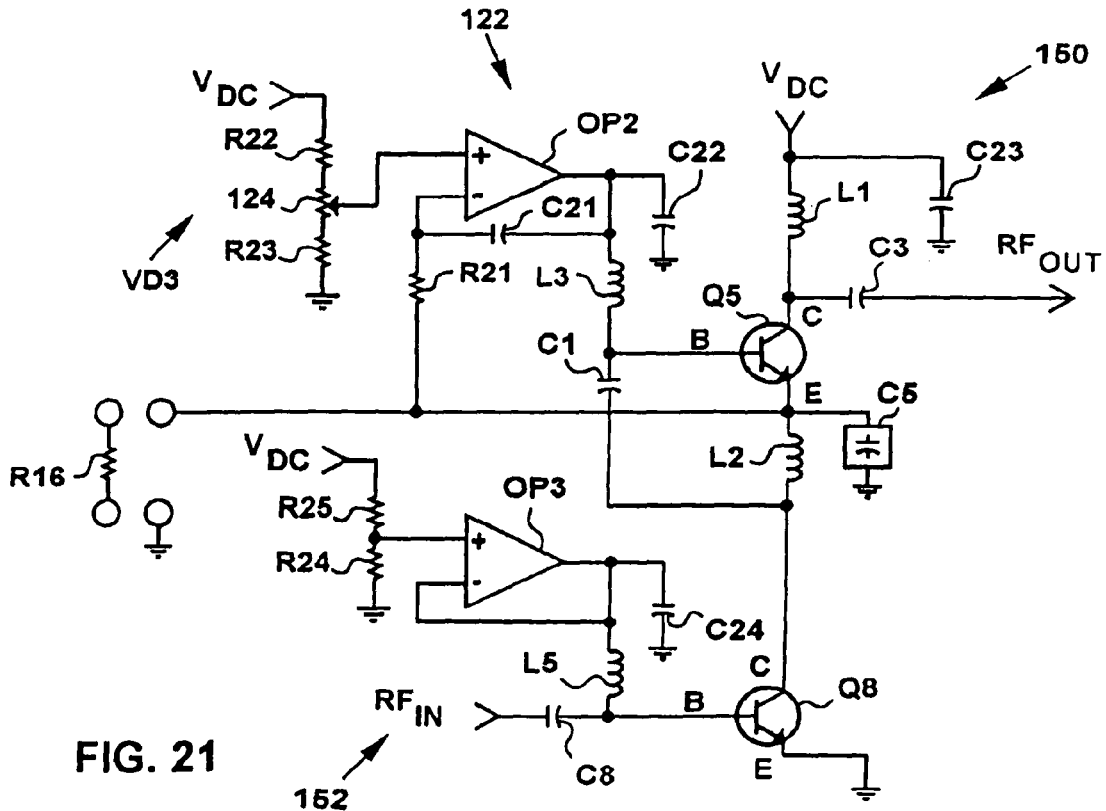
FIG. 21 is an rf power amplifier, or a shared-current electronic system in which two bipolar-junction transistors replace the gallium arsenide FETs of FIG. 20, and the dc source voltage is precisely proportioned to one of the transistors irrespective of operating parameter variations in components and/or component drift.

Referring now to FIG. 21, an rf power amplifier, electronic apparatus, or shared-current electronic system, 150 includes like-named and like-numbered components as shown and described for the rf amplifier 140 of FIG. 20, except that bipolar-junction transistors, or electronic devices, Q5 and Q8 replace the FETs Q1 and Q7 of the rf amplifier 140, and except that a clamped voltage divider 152 is added to provide a bias voltage for the transistor Q8.

The clamped voltage divider 152 of FIG. 21 includes like-numbered and like-named components as the clamped voltage divider 132 of FIG. 19, except that the resistors R24 and R25 of FIG. 21 fixedly divide the dc source voltage, instead of the bias voltage being adjusted by the potentiometer 124 of FIG. 19.

Figure 22:
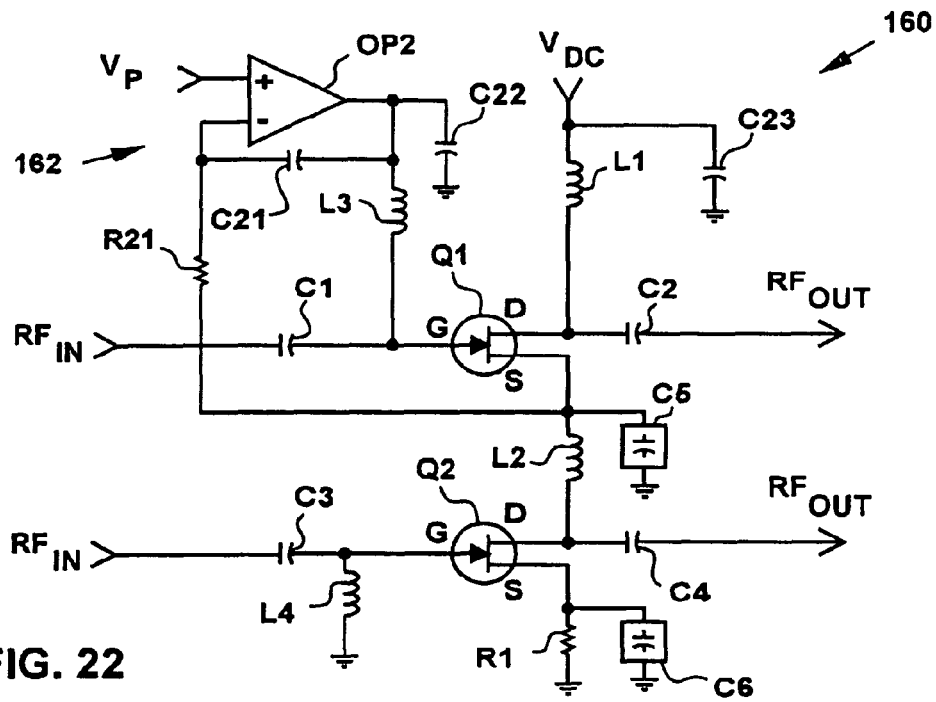
FIG. 22 is a schematic drawing of a power-shifting rf oscillator showing how the power-shifting rf amplifier of FIG. 7 can be adapted, by insertion of a precise proportioner, to minimize power shifting variations caused by operating parameter variations in components and/or component drift.

Referring now to FIG. 22, a power-shifting rf power amplifier, a power-shifting rf amplifier, an electronic apparatus, or shared-current electronic system, 160 includes like-named and like-numbered components as those of the power-shifting rf amplifier 66 of FIG. 7, except that the splitter 50 of the power-shifting rf amplifier 160 is not shown, and the combiner 52 of FIG. 6 has been omitted, and the precise proportioner 162 has been added.

The precise proportioner 162 is identical to the precise proportioner 122 of FIG. 18, except that the variable voltage divider VD3 has been omitted and a resistor R21 has been added. Instead of including the variable voltage divider VD3, a variable proportioning voltage $V_P$ of FIG. 22 is supplied to the positive input terminal of the operational amplifier OP2 by the proportioning control 54 of FIGS. 6 and 7.

Operation of the power-shifting rf amplifier 160 of FIG. 22 is as described for the power-shifting rf amplifier 66 of FIG. 7, except for variable precise proportioning of the dc source voltage to the FET Q1. That is, in response to the proportioning voltage $V_P$ that is supplied by the proportioning control 54 of FIG. 7, the dc source voltage is variably and precisely proportioned to the FET Q1.

Figure 23:
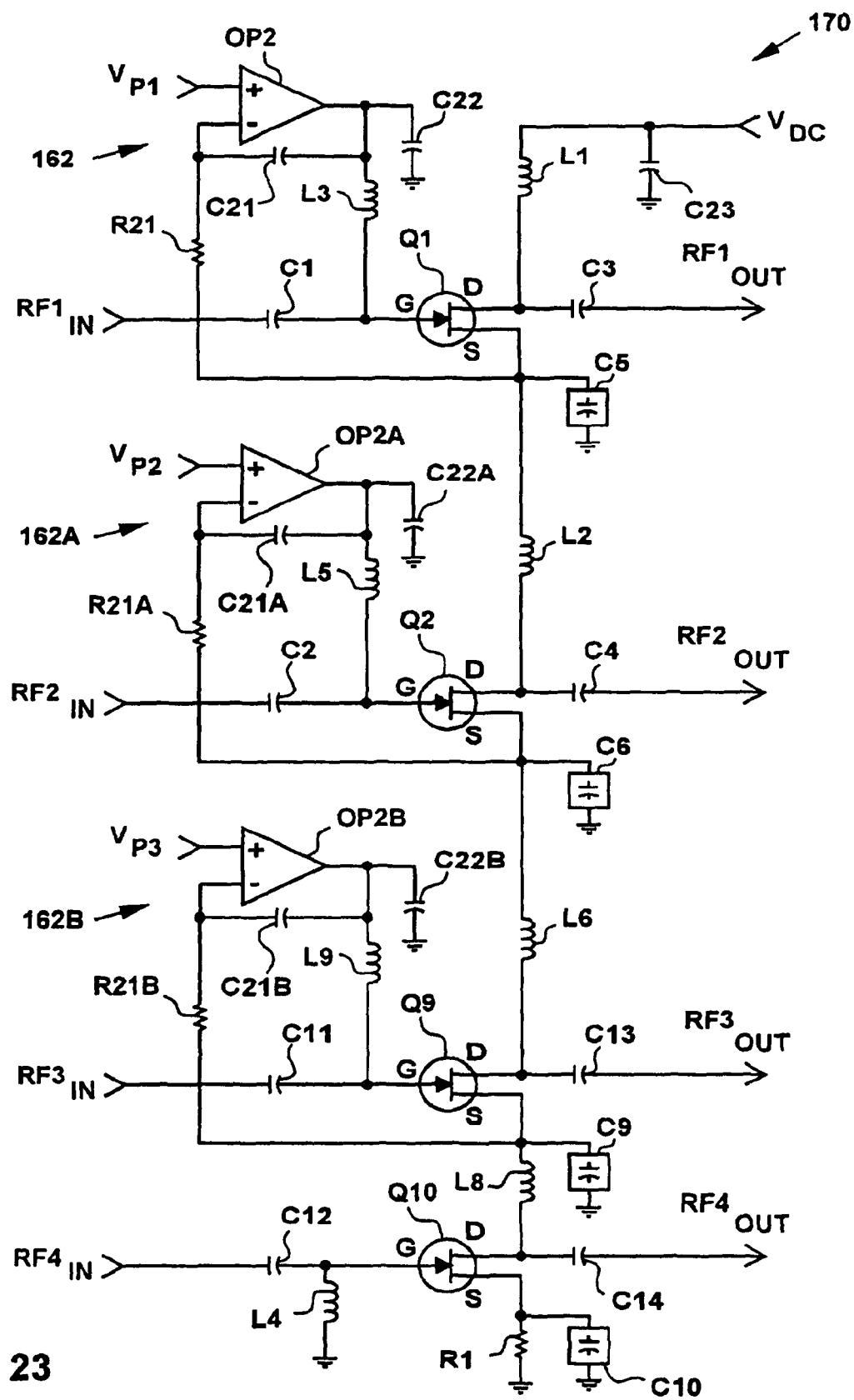
FIG. 23 is a schematic drawing of a variable power-shifting rf oscillator showing how the power-shifting rf amplifier of FIG. 10 can be adapted, by using precise proportioners for three of the four FETs, to minimize power-shifting variations caused by operating parameter variations in components and/or component drift.

Referring now to FIG. 23, a power-shifting rf power amplifier, a power-shifting rf amplifier, an electronic apparatus, or a shared current electronic system, 170 includes like-named and like-numbered components as those of the power-shifting rf amplifier 82 of FIG. 10, except that the splitters 74, 76A, and 76B of the power-shifting rf amplifier 170 are not shown and three precise proportioners 162, 162A, and 162B have been added.

The precise proportioners 162A and 162B of FIG. 23 are identical to the precise proportioner 162 of FIG. 22, except for suffix letters added to the second and third ones of the precise proportioners.

Operation of the power-shifting rf amplifier 170 of FIG. 23 is as described for the power-shifting rf amplifier 82 of FIG. 10, except for variable precise proportioning of the dc source voltage to the FETs Q1, Q2, and Q9. That is, in response to variable proportioning voltages $V_{P1}$, $V_{P2}$, and $V_{P3}$, that are supplied by the proportioning control 72 of FIGS. 8 and 10, the dc source voltage $V_{DC}$ of the rf amplifier 170 of FIG. 23 is variably and precisely proportioned to the FETs Q1, Q2, and Q9, and Q10.

The proportioning control 72 produces the proportioning voltages $V_{P1}$, $V_{P2}$, and $V_{P3}$ in response to the proportioning control voltage $V_{PC}$. The rf output $RF2_{OUT}$ is at 90 degrees to the rf output $RF1_{OUT}$, the rf output $RF3_{OUT}$ is at 180 degrees to the rf output $RF1_{OUT}$, and the rf output $RF4_{OUT}$ is at 270 degrees to the rf output $RF1_{OUT}$.

Figure 24:
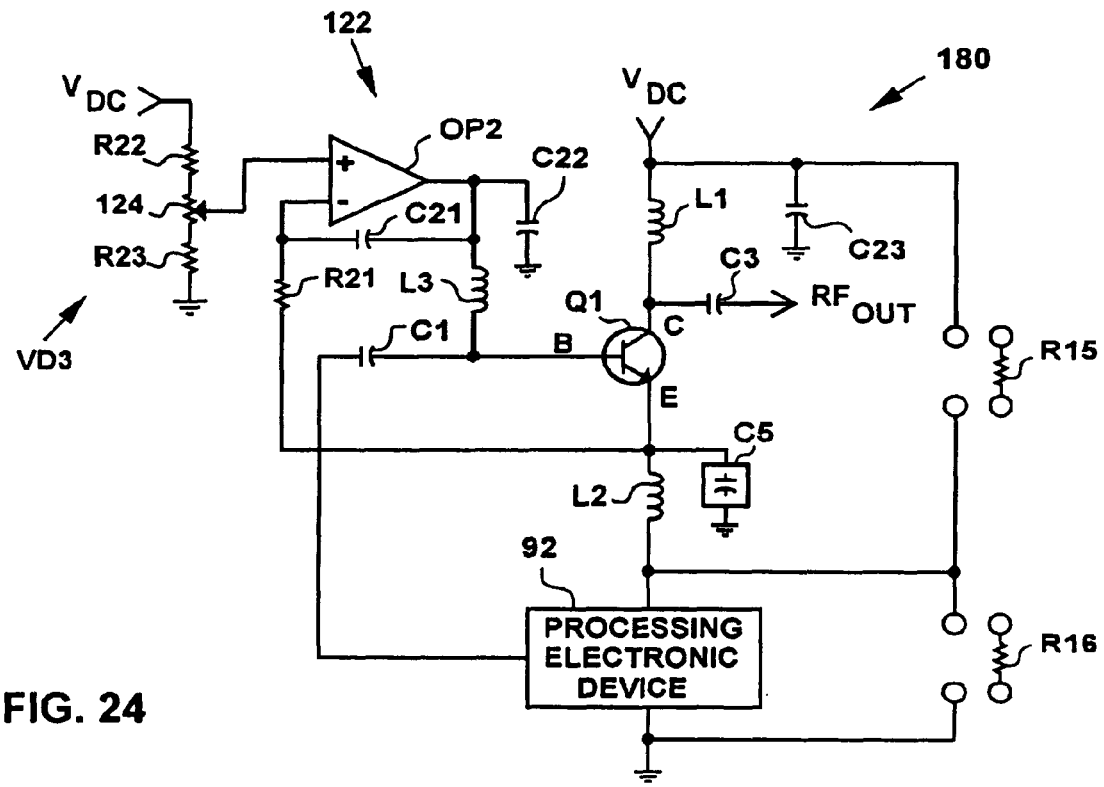
FIG. 24 is a shared-current electronic system that is similar to the shared-current electronic system of FIG. 12, except that the processing electronic device and the gallium arsenide FET of FIG. 24 are in both dc series and rf series, and except that the shared-current electronic system of FIG. 24 precisely proportions the dc source voltage to the GaAsFET.

Referring now to FIG. 24, a shared-current electronic apparatus, or shared-current electronic system 180 includes like-named and like-numbered parts as the shared-current electronic system 90 of FIG. 12, except that the processing electronic device 92 is connected in rf series with the FET Q1, so that the processing electronic device 92 and the FET Q1 are connected in both dc series and rf series. Also, the variable voltage divider VD1 of FIG. 12 has been replaced in FIG. 24 with the precise proportioner 122 of FIG. 18.

Operation of the shared-current electronic apparatus 180 of FIG. 24 is as described for the shared-current electronic apparatus 90 of FIG. 12, except that the processing electronic device 92 delivers an rf signal to the FET Q1 for amplification therein. Also, the precise proportioner 122 of FIG. 18, as included in the shared-current electronic apparatus 180, precisely proportions the dc source voltage to the FET Q1, thereby enhancing frequency stability, and providing other benefits, as recited previously, irrespective of production variations in component operating parameters, and irrespective of drift in component operating parameters.

Figure 25:
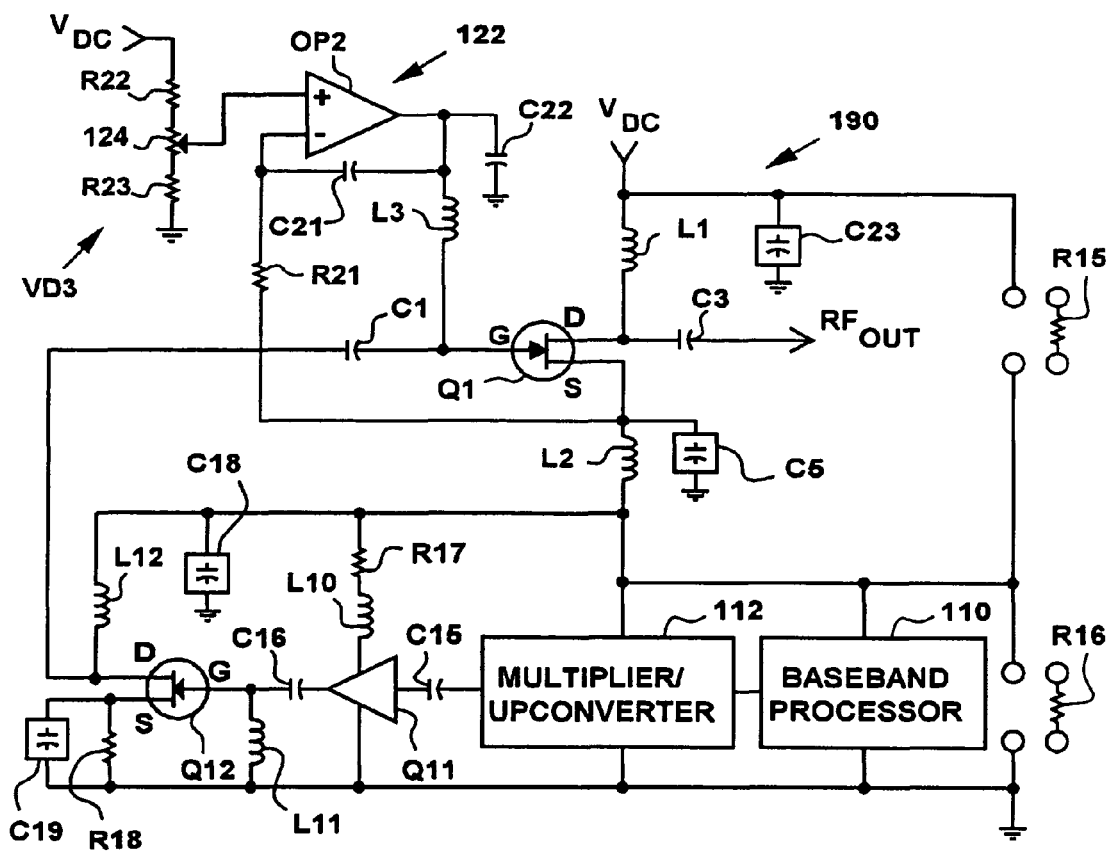
FIG. 25 is a shared-current electronic system that is similar to the shared-current electronic system of FIG. 15, except that the bandwidth processing device and the gallium arsenide FET of FIG. 25 are in both dc series and rf series, and except that the shared-current electronic system of FIG. 25 precisely proportions the dc source voltage to the GaAsFET.

Referring now to FIG. 25, a shared-current electronic apparatus, or shared-current electronic system 190 includes like-named and like-numbered parts as the shared-current electronic system 108 of FIG. 15, except that the variable voltage divider VD1 of FIG. 15 has been replaced in FIG. 25 with the precise proportioner 122 of FIG. 18.

It is important to notice that, in both FIGS. 15 and 25, the baseband processing device 110, the multiplier/up-converter 112, the gain block Q11, and the FET Q12 are connected in dc parallel, the baseband processing device 110, the multiplier/up-converter 112, the gain block Q11, and the FET Q12 are connected in dc series with the FET Q1, and all five of these electronic devices are connected in rf series.

Connecting the baseband processing device 110, the multiplier/up-converter 112, the gain block Q11, and the FET Q12 in dc series makes their combined current requirements more nearly equal to that of the FET Q1, which is the power amplifier stage. However, if the FET Q1 requires more or less current flow than the parallel-connected four electronic devices, the resistor R16 or the resistor R15 may be connected to bypass additional current, as needed.

Operation of the shared-current electronic apparatus 190 of FIG. 25 is as described for the shared-current electronic apparatus 108 of FIG. 15, except that the precise proportioner 122 of FIG. 18, as included in the shared-current electronic apparatus 190, precisely proportions the dc source voltage to the FET Q1, providing benefits as described previously, irrespective of production variations in component operating parameters, and irrespective of drift in component operating parameters.

Figure 26:
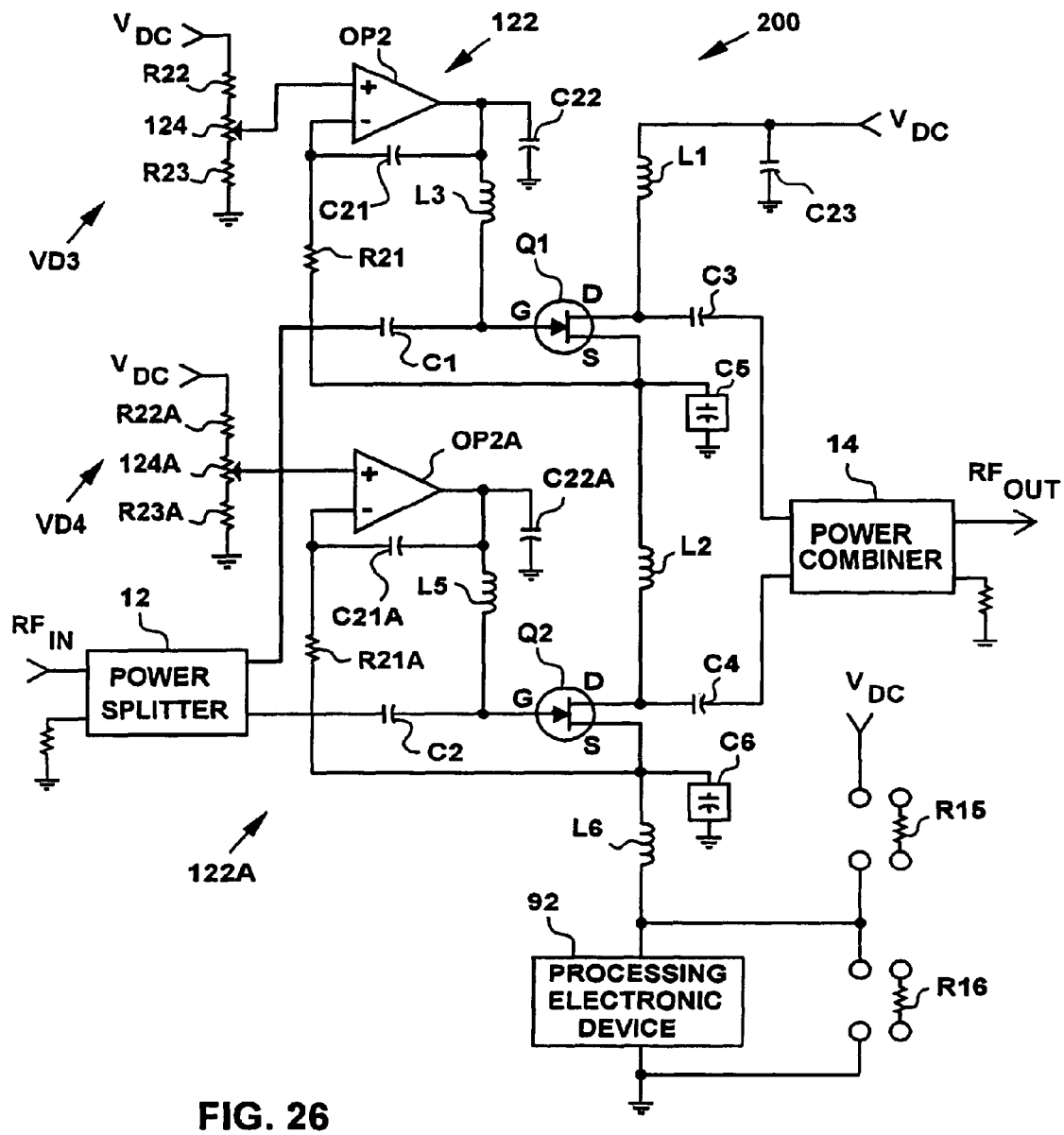
FIG. 26 is a shared-current electronic system that is similar to the shared-current electronic system of FIG. 18, except that a processing electronic device is connected in dc series with the device and the GaAsFETs of FIG. 18, and except that precise proportioners precisely proportion the dc source voltage to the two FETs.

Referring now to FIG. 26, a phase-shifting rf amplifier, a shared-current electronic apparatus, or shared-current electronic system 200 includes like-named and like-numbered parts as the shared-current electronic system 10 of FIG. 1, except that the processing electronic device 92 of FIG. 12 is connected in dc series with the GaAsFETs Q1 and Q2, and except that the resistors R15 and R16 have been added. More importantly, two precise proportioners, 122 and 122A have been added, thereby precisely proportioning the dc source voltage between the FETs Q1 and Q2. The precise proportioner 122 is as shown in FIG. 20, and described therewith. The precise proportioner 122A includes like-named and like-numbered components with an alphabetic suffix.

Operation of the shared-current electronic apparatus 200 is as described for the shared-current electronic apparatus 10 of FIG. 1, except for dc series connection of the processing electronic device 92 to the FETs Q1 and Q2, which utilizes a precise proportion of the dc source voltage.

Figure 27:
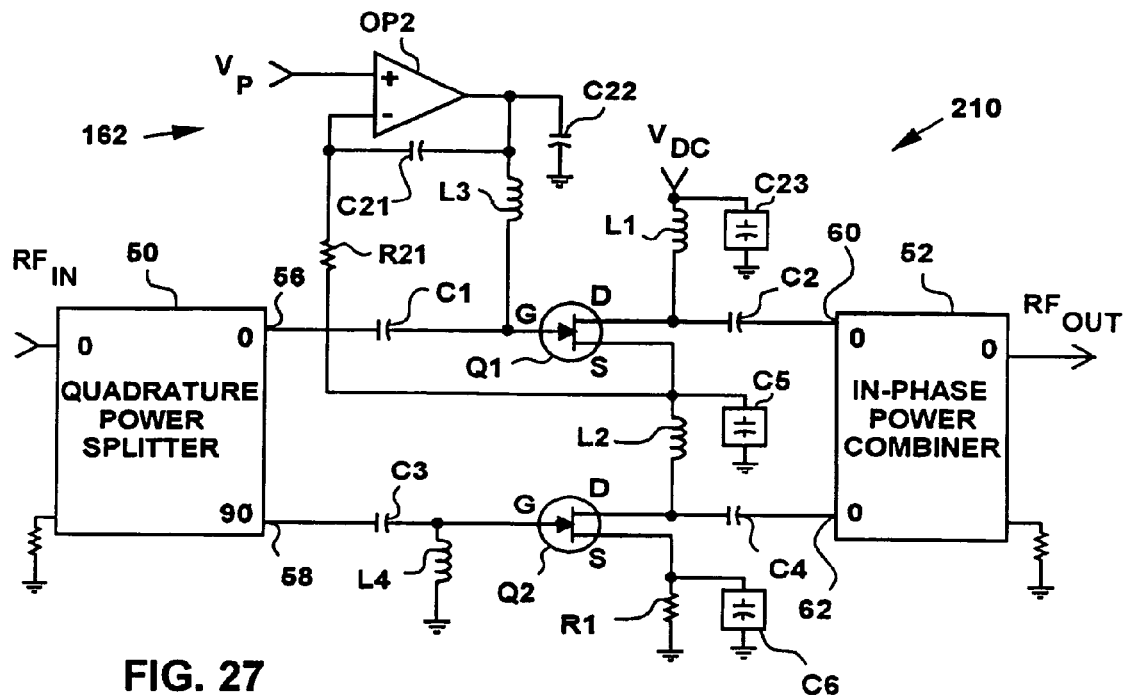
FIG. 27 is a variable phase-shifting rf oscillator showing how the phase-shifting rf amplifier of FIG. 6 can be adapted, in accordance with the present invention, by insertion of a precise proportioner, to minimize phase-shifting variations caused by operating parameter variations in components and/or drift in operating parameters.

Referring now to FIG. 27, a phase-shifting rf amplifier, electronic apparatus, or shared-current electronic system 210 includes like-named and like-numbered components as those of the phase-shifting rf power amplifier 48 of FIG. 6, and functions the same as the phase-shifting rf power amplifier 48, except that the precise proportioner 162 has been added to minimize variations in phase-shifting caused by variations in component parameters and or drift in component parameters.

Operation of the phase-shifting rf amplifier 210 is as described for the phase-shifting rf amplifier 48 of FIG. 6, except for variable precise proportioning of the dc source voltage to the FET Q1 of the rf amplifier 160. That is, in response to the proportioning voltage $V_P$ that is supplied by the proportioning control 54 of FIG. 6, the precise proportioner 162 precisely supplies selected percentages of the dc source voltage to the FET Q1.

Figure 28:
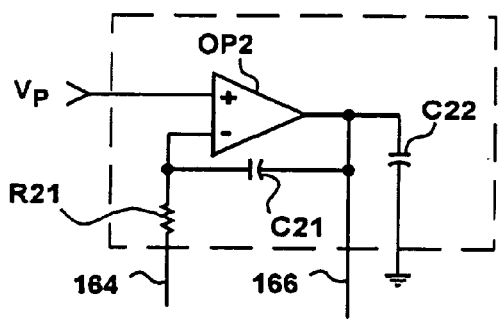
FIG. 28 is a schematic drawing of the precise proportioner of FIG. 29, showing the components thereof, and showing the four connections that are made in circuits with precise proportioners, such as the power-shifting rf amplifier of FIG. 23 and the phase-shifting rf power amplifier of FIG. 30.

Referring now to FIG. 28, the precise proportioner 162 of FIGS. 22, 23, 27, and 30 is shown in schematic form and includes the operational amplifier OP2, the capacitors C21 and C22, and the resistor R21. Conductors 164 and 166 are labeled as an aid in understanding FIG. 28.

Figure 29:
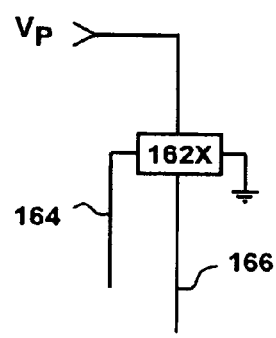
FIG. 29 is a black-box drawing of the precise proportioner of FIG. 28, showing the four connections that are made in circuits with precise proportioners, such as the power-shifting rf amplifier of FIG. 23 and the phase-shifting rf power amplifier of FIG. 30.

Referring now to FIG. 29, the precise proportioner 162 of FIG. 28 is shown as a black box 162X. Conductors 164 and 166, as included in both FIGS. 28 and 29, make connections of the black box 162X to FIG. 30 perfectly clear.

Figure 30:
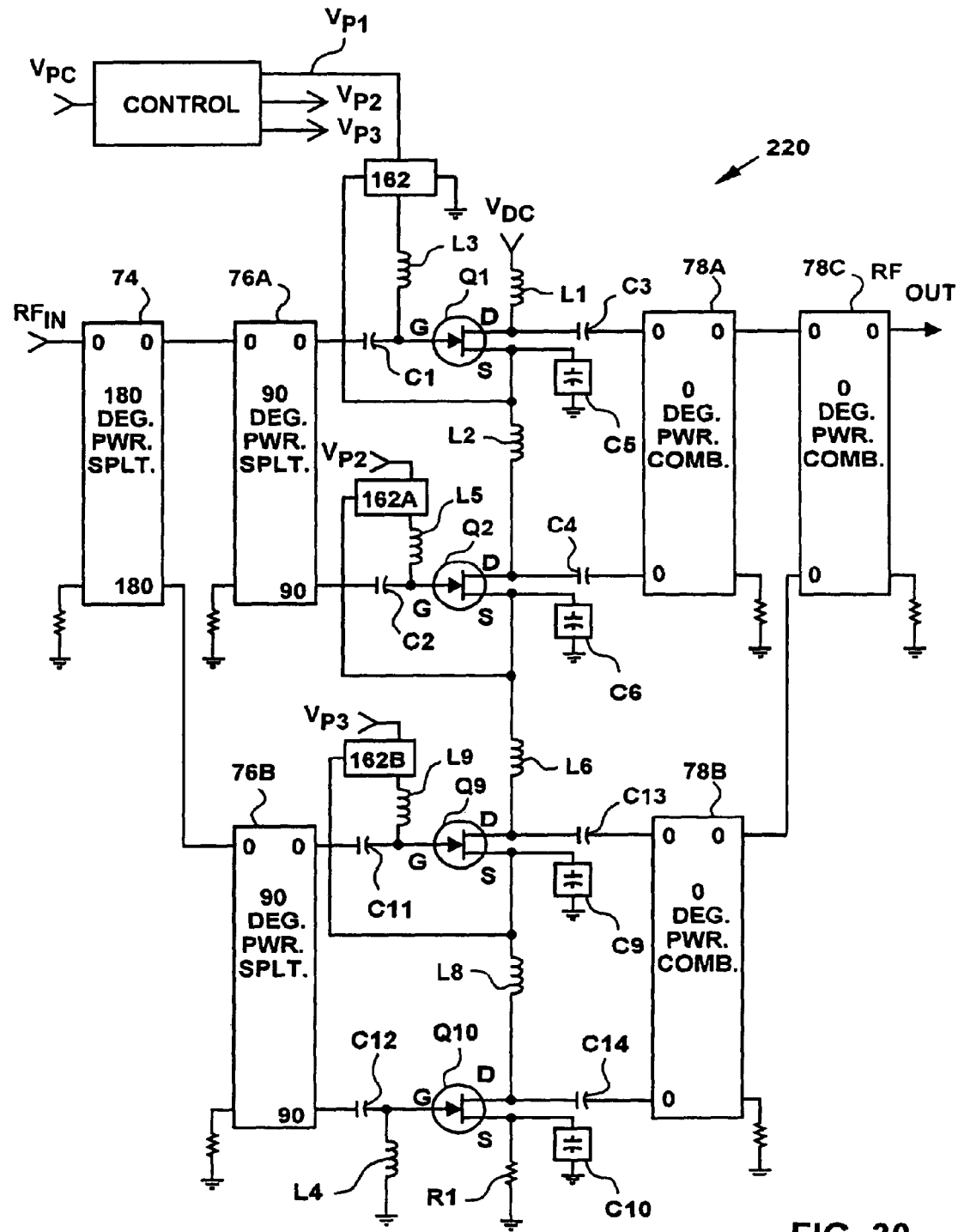
FIG. 30 is a schematic drawing of a variable phase-shifting rf oscillator showing how the variable phase-shifting rf power amplifier of FIG. 8 can be adapted, by using precise proportioners for three of the four FETs, to minimize phase-shifting variations caused by operating parameter variations in components and/or component drift.

Referring now to FIG. 30, a phase-shifting rf oscillator, an rf power amplifier, electronic apparatus, or a shared-current electronic system, 220 includes like-named and like-numbered components as those of the phase-shifting rf power amplifier 70 of FIG. 8. In addition, three precise proportioners 162, 162A, and 162B have been added. The precise proportioners 162A and 162B of FIG. 30 are identical to the precise proportioner 162 of FIG. 28 and the precise proportioner 162X of FIG. 29, except for suffix letters added to the second and third ones of the precise proportioners 162.

Operation of the phase-shifting rf amplifier 220 of FIG. 30 is as described for the phase-shifting rf amplifier 70 of FIG. 8, except for variable precise proportioning of the dc source voltage to the FETs Q1, Q2, and Q9 by the precise proportioners 162, 162A, and 162B. That is, in response to variable proportioning voltages $V_{P1}$, $V_{P2}$, and $V_{P3}$, that are supplied by the proportioning control 72 of FIG. 8, the dc source voltage $V_{DC}$ of the rf amplifier 220 of FIG. 30, is variably and precisely proportioned to the FETs Q1, Q2, and Q9 as described in conjunction with FIG. 23.

Referring again to FIG. 7, as taught in conjunction with the power-shifting rf amplifier 66, if the rf input signal $RF_{IN}$, is split by a quadrature power splitter, such as the quadrature power splitter 50, quadrature rf signals are supplied to the gate terminals of the FETs Q1 and Q2, and the rf outputs $RF1_{OUT}$ and $RF2_{OUT}$ are in quadrature. But, if an in-phase splitter is substituted for the quadrature power splitter 50, the two rf outputs $RF1_{OUT}$ and $RF2_{OUT}$ will be in phase.

Referring again to FIG. 23, in like manner, if the rf outputs RF2, RF3, and RF4 of the phase-shifting rf amplifier 220 are provided by 90 and 180 degree splitters, such as the splitters 74, 76A, and 76B, then the rf outputs will be at 0, 90, 180, and 270 degrees. Or, if the electronic device Q10 and the splitter 76B are omitted from the power-shifting rf amplifier 220, then the rf outputs will be at 0, 90, and 180 degrees.

Referring again to FIGS. 18-27 and 30, one precise proportioner 122 or 162 is required for two electronic devices, such as GaAsFETs Q1 and Q2. Further, as shown in FIGS. 18-27 and 30, the required number of precise proportioners, such as the precise proportioners 122 and 122A of FIG. 26, and the precise proportioners 162, 162A, and 162B of FIGS. 23 and 30, is one less than the number of dc series-connected electronic devices.

The use of a clamped voltage divider, such as the clamped voltage divider 132 of FIG. 19, is advantageous when external bias must be applied, especially for electronic devices that use substantial bias current. However, as previously noted, the clamped voltage dividers, such as the clamped voltage divider 132 of FIG. 19, merely provide a stable bias voltage. It is the precise proportioners, such as the precise proportioner 122 of FIGS. 18-21 and 24-26, and the precise proportioner 162 of FIGS. 22, 23, 27, and 30 that precisely proportion the dc source voltage to one or more electronic devices, such as the FET Q1 of FIG. 18, the bipolar-junction transistor Q5 of FIG. 19, and the FETs Q1, Q2, and Q9 of FIGS. 23 and 30.

As can be seen in FIG. 8, two solid-state electronic devices, such as the FETs Q2 and Q9, are connected in dc series between the dc source voltage $V_{DC}$ and an electrical ground, even though one is connected indirectly to the dc source voltage $V_{DC}$ and the other is connected indirectly to the electrical ground.

In summary, the present invention can be characterized as providing apparatus with both constant and variable power, in which at least one solid-state electronic device and at least one other electronic device, whether a solid-state electronic device or a processing electronic device, proportionally or variably share the dc source voltage, and in which a single rf output, or a plurality of rf outputs, are produced.

Further, the present invention can be characterized as providing apparatus in which two or more rf outputs may be phase shifted, in which the total rf output may be variably shifted between/among a plurality of rf outputs, or in which the total rf power may be switched between/among a plurality of rf outputs, all without substantially varying the total rf power, and bandwidth compression is achieved with improved power efficiency.

Most importantly, all of the above functions are performed precisely, without regard to production variations in component operating parameters and/or drift in component operating parameters, because, in the present invention, all but one of the dc series-connected electronic devices precisely share predetermined proportions of the dc source voltage, irrespective of production variations in component operating parameters and/or drift in component operating parameters. As described above, precise proportioning of the dc source voltage is achieved by precisely determining the dc voltage used by each of the dc series-connected electronic devices except one. The precise proportions may be fixed, or selectively adjusted. Finally, these precise proportions may be variably controlled for use in phase-shifting and power-shifting rf amplifiers, as taught herein.

In addition to the steps recited in the aspects of the invention, the methods of the present invention optionally include various combinations of the following steps: in-phase splitting; quadrature splitting; splitting into first and second rf signals at different phase angles; combining the rf outputs into a single rf output; phase shifting the single rf output substantially linearly in response to a single phase-shifting voltage; selectively proportioning the total rf output to the rf outputs in response to a single control voltage; and/or selectively switching the total rf output to either of the rf outputs while maintaining the total rf output substantially constant.

The methods of the present invention also optionally include: splitting an rf input into at least three rf signals; variably amplifying the rf signals into variable rf outputs; phase shifting the total rf output as a substantially linear function of a single phase-control voltage; combining the separately-amplified rf signals into a single rf output; phase shifting the single rf output up to 180 degrees as a substantial linear function of the phase-control voltage; and/or binary-phase-shift-key modulating the single rf output.

The methods of the present invention still further optionally include: splitting the rf input into 0, 90, 180, and 270 degree rf signals; producing rf outputs at 0, 90, 180, and 270 degrees; combining the rf outputs into a single rf output; phase shifting the total rf output as a substantially linear function of a single phase-control voltage; connecting one of the rf outputs to each of four antennas; selectively proportioning the total rf power to the antennas in response to a single power-shifting voltage; and/or selectively switching the total rf power to a selected one of the antennas while maintaining the total power substantially constant.

While specific apparatus and method have been disclosed in the preceding description it should be understood that these specifics have been given for the purpose of disclosing the principles of the present invention, and that many variations thereof will become apparent to those who are versed in the art.

What is claimed is:

1. A method which comprises:
    a) variably amplifying a first rf signal in a first electronic device into a variable rf output;
    b) simultaneously amplifying a second rf signal in a second electronic device into a second rf output;
    c) said amplifying steps comprise inversely changing portions of a dc source used by each electronic device; and
    d) preventing operating parameters in one or both of said electronic devices or drift of said operating parameters in one or both of said electronic devices from affecting more than one of said portions.

2. The method as claimed in claim 1 in which:
    a) said amplifying steps comprise amplifying rf signals having different phase angles;

b) said method further comprises combining said rf outputs into a total rf output subsequent to said amplifying steps; and
c) said method still further comprises phase shifting said total rf output.

3. The method as claimed in claim 1 in which:
a) said amplifying steps comprise amplifying rf signals having different phase angles;
b) said method further comprises combining said rf outputs into a total rf output subsequent to said amplifying steps; and
c) said method still further comprises phase shifting said total rf output in response to a single phase-control signal.

4. The method as claimed in claim 1 in which:
a) said amplifying steps comprise amplifying rf signals having different phase angles;
b) said method further comprises combining said rf outputs into a total rf output subsequent to said amplifying steps; and
c) said method still further comprises phase shifting said total rf output substantially linearly in response to a phase-control signal.

5. The method as claimed in claim 1 in which:
a) said amplifying steps, together with an other amplifying step, comprise producing rf outputs at 0, 90, and 180 degrees;
b) said method further comprises combining said 0, 90, and 180 degree rf outputs into a total rf output; and
c) said method still further comprises phase shifting said total rf output.

6. The method as claimed in claim 1 in which said variable amplifying step comprises selectively proportioning a total rf output to said rf outputs in response to a proportioning signal.

7. The method as claimed in claim 1 in which said variable amplifying step comprises selectively proportioning a total rf output to said rf outputs while maintaining said total rf output substantially constant.

8. The method as claimed in claim 1 in which said method comprises selectively switching a total rf output to either of said rf outputs in response to a switching signal.

9. The method as claimed in claim 1 in which said method comprises selectively switching a total rf output to either of said rf outputs while maintaining said total rf output substantially constant.

10. A method which comprises:
a) amplifying a first rf signal in a first electronic device into a first rf output;
b) simultaneously amplifying a second rf signal in a second electronic device into a second rf output;
c) said amplifying steps comprise each of said electronic devices using separate portions of a single dc source; and
d) preventing operating parameters in one or both of said electronic devices or drift of said operating parameters in one or both of said electronic devices from affecting more than one of said portions.

11. The method as claimed in claim 10 in which:
a) said amplifying steps comprise amplifying rf signals having different phase angles;
b) said method further comprises combining said rf outputs into a total rf output subsequent to said amplifying steps; and
c) said method still further comprises phase shifting said total rf output in response to a phase-control signal.

12. The method as claimed in claim 10 in which:
a) said amplifying steps comprise amplifying rf signals having different phase angles;
b) said method further comprises combining said rf outputs into a total rf output subsequent to said amplifying steps; and
c) said method still further comprises phase shifting said single rf output substantially linearly in response to a phase-control signal.

13. The method as claimed in claim 10 in which said method comprises selectively proportioning a total rf output to said rf outputs in response to a proportioning signal.

14. The method as claimed in claim 10 in which said method comprises selectively switching a total rf output to either of said rf outputs in response to a switching signal.

15. The method as claimed in claim 10 in which said method comprises selectively switching a total rf output to either of said rf outputs while maintaining said total rf output substantially constant.

16. A method which comprises:
a) variably amplifying a plurality of rf signals in a plurality of electronic devices into a plurality of variable rf outputs;
b) said amplifying steps comprise each of said amplifying steps using separate portions of a dc source; and
c) preventing operating parameters in any or all of said electronic devices or drift of said operating parameters in any or all of said electronic devices from affecting more than one of said portions.

17. The method as claimed in claim 16 in which said method further comprises:
a) combining said variable rf outputs into a total rf output; and
b) phase shifting said total rf output in response to a phase-control signal.

18. The method as claimed in claim 16 in which said method further comprises:
a) combining said variable rf outputs into a total rf output; and
b) phase shifting said total rf output as a substantially linear function of a phase-control signal.

19. The method as claimed in claim 16 in which said amplifying step comprises producing rf outputs at 0, 90, and 180 degrees, and said method further comprises:
a) combining said 0, 90, and 180 degree rf outputs into a total rf output; and
b) phase shifting said total rf output.

20. The method as claimed in claim 16 in which said amplifying step comprises producing rf outputs at 0, 90, 180, and 270 degrees, and said method further comprises:
a) combining said rf outputs into a total rf output; and
b) phase shifting said total rf output up to 270 degrees as a substantially linear function of a phase-control signal.

21. The method as claimed in claim 16 in which said method comprises:
a) combining said rf outputs into a total rf output; and
b) selectively proportioning said total rf output to said rf outputs in response to a proportioning signal.

22. The method as claimed in claim 16 in which said method comprises:
a) combining said rf outputs into a total rf output; and
b) selectively switching said total rf output to either of said rf outputs in response to a switching signal.

23. The method as claimed in claim 16 in which said method comprises:
a) combining said rf outputs into a total rf output; and
b) selectively switching said total rf output to either of said rf outputs while maintaining said total rf output substantially constant.

24. Apparatus which comprises:

a dc source;

means, comprising a plurality of electronic devices that each use separate portions of said dc source, for variably amplifying a plurality of rf signals into a plurality of variable rf outputs; and means for preventing operating parameters in any or all of said electronic devices or drift of said operating parameters in any or all of said electronic devices from affecting more than one of said portions.

25. Apparatus as claimed in claim 24 in which said apparatus further comprises:

means for combining said variable rf outputs into a total rf output; and means for phase shifting said total rf output.

26. Apparatus as claimed in claim 24 in which said apparatus further comprises means for proportioning a total rf output to said rf outputs while maintaining said total rf output substantially constant.

27. Apparatus as claimed in claim 24 in which said apparatus further comprises means for switching a total rf output to either of said rf outputs while maintaining said total rf output substantially constant.

* * * * *

UNITED STATES PATENT AND TRADEMARK OFFICE
CERTIFICATE OF CORRECTION

PATENT NO. : 7,936,218 B1  Page 1 of 1
APPLICATION NO. : 12/075787
DATED : May 3, 2011
INVENTOR(S) : Barry Arthur Lautzenhiser and Lloyd Lynn Lautzenhiser It is certified that error appears in the above-identified patent and that said Letters Patent is hereby corrected as shown below:

On the title page, Item (54) the title should read --SHARED-CURRENT ELECTRONIC SYSTEMS--

Column 1, line 1, should read --SHARED-CURRENT ELECTRONIC SYSTEMS--.
Column 18, line 60, "to" production should read --of-- production.
Column 20, line 17, "to of the transistor" should read --to the transistor--.
Column 21, line 25, delete ", and Q10".

Signed and Sealed this
Nineteenth Day of June, 2012

David J. Kappos
*Director of the United States Patent and Trademark Office*